(12) United States Patent
Kuriki et al.

(10) Patent No.: US 7,819,508 B2
(45) Date of Patent: Oct. 26, 2010

(54) DIELECTRIC FILM AND PIEZOELECTRIC ELEMENT

(75) Inventors: Akira Kuriki, Nagano-ken (JP); Koji Sumi, Nagano-ken (JP); Hironobu Kazama, Nagano-ken (JP); Motoki Takabe, Nagano-ken (JP); Motohisa Noguchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 727 days.

(21) Appl. No.: 11/392,757

(22) Filed: Mar. 30, 2006

(65) Prior Publication Data

US 2006/0230590 A1    Oct. 19, 2006

(30) Foreign Application Priority Data

Mar. 31, 2005  (JP) .............................. 2005-104517
Mar. 2, 2006   (JP) .............................. 2006-056096

(51) Int. Cl.
*B41J 2/45* (2006.01)
*H01L 41/08* (2006.01)
*C04B 35/00* (2006.01)

(52) U.S. Cl. .............................. 347/68; 347/71; 347/70; 310/311; 310/357; 310/358; 252/62.9 PZT

(58) Field of Classification Search ................. 257/295; 347/68, 70, 71; 310/311, 357, 358; 252/62.9
See application file for complete search history.

(56) References Cited

U.S. PATENT DOCUMENTS 6,056,994 A    5/2000 Paz de Araujo et al.

(Continued)

FOREIGN PATENT DOCUMENTS

EP    1 517 382 A1    3/2005

(Continued)

OTHER PUBLICATIONS

Seshu B. Desu et al., "Characterization of Ferroelectric Thin Films by ESCA", Res. Soc Pittsburgh, PA, USA, 1990, pp. 267-274, XP001248414.

(Continued)

*Primary Examiner*—Zandra Smith
*Assistant Examiner*—Telly D Green
(74) *Attorney, Agent, or Firm*—Sughrue Mion, PLLC

(57) ABSTRACT

A method for producing a dielectric film, comprising: a coating step of coating a colloidal solution containing an organometallic compound containing a metal constituting a dielectric film containing at least a lead component to form a dielectric precursor film; a drying step of drying the dielectric precursor film; a degreasing step of degreasing the dielectric precursor film; and a sintering step of sintering the dielectric precursor film to form a dielectric film, and wherein the drying step includes a first drying step of heating the dielectric precursor film to a temperature lower than the boiling point of a solvent, which is a main solvent of the material, and holding the dielectric precursor film at the temperature for a certain period of time to dry the dielectric precursor film, and a second drying step of drying the dielectric precursor film at a temperature in the range of 140° C. to 170° C., the degreasing step is performed at a degreasing temperature of 350° C. to 450° C. and at a heating-up rate of 15 [° C./sec] or higher, and the sintering step is performed at a heating-up rate of 100 [° C./sec] to 150 [° C./sec].

5 Claims, 17 Drawing Sheets

U.S. PATENT DOCUMENTS

| | | | |
|---|---|---|---|
| 7,048,360 B2* | 5/2006 | Kanno et al. | 347/68 |
| 2001/0041459 A1 | 11/2001 | Smith et al. | |
| 2005/0150446 A1* | 7/2005 | Lee et al. | 117/54 |

FOREIGN PATENT DOCUMENTS

| | | |
|---|---|---|
| EP | 1 589 566 A2 | 10/2005 |
| JP | 06-005946 A | 1/1994 |
| JP | 09-223830 A | 8/1997 |
| JP | 2000-079689 A | 3/2000 |
| JP | 2001-089138 A | 4/2001 |
| JP | 2004-111851 A | 4/2004 |
| WO | WO 94/10702 A1 | 5/1994 |
| WO | WO 99/05712 A1 | 2/1999 |

OTHER PUBLICATIONS

Chi. K. Kwok et al., "Conducting Oxide Electrodes for Ferroelectric Films", Integrated Ferroelectrics, New York, NY, USA, vol. 3, No. 2, 1993, pp. 121-130 XP000890028.

Liu Qin et al., "Magnetically Enhanced Reactive Ion Etching of Ferroelectric", Chinese Journal of Semiconductors Science Press China, vol. 20, No. 11, Nov. 1999, pp. 1044-1048, XP001248415.

Daisuke Akai et al., "Fabrication of Pb(Zr,Ti)$O_3$ Films on Epitaxial γ-$Al_2O_3$(001)/Si(001) Substrates", Journal of Crystal Growth, Elsevier, Amsterdam, NL, vol. 259, No. 1-2, Nov. 2003, pp. 90-94, XP004464581.

Reji Thomas et al., "Effect of Substrate Temperature on the Crystallization of Pb(Zr,Ti)$O_3$ Films on Pt/Ti/Si Substrates Prepared by Radio Frequency Magnetron Sputtering with a Stoichiometric Oxide Target", Materials Science and Engineering B, Elsevier Sequoia, Lausanne, CH, vol. 95, No. 1, Jul. 1, 2002, pp. 36-42, XP0043 70674.

Kwang B. Lee et al., "Compositional Dependence of the Properties of Ferroelectric Pb($Zr_xTi_{1-x}$)$O_3$ Thin Film Capacitors Deposited on Single-Layered PtRh$O_y$ Electrode Barriers", Ceramics International, Ceramurgica, Faenza, IT, vol. 30, No. 7, 2004, pp. 1543-1546, XP004534289.

* cited by examiner

FIG. 8

| Conditions set | Temperature [°C] | Rate [°C/sec] | Zr / Ti ratio [%] | (100) half-width [°] | Amount of foreign matter |
|---|---|---|---|---|---|
| ① 335°C 8 mm jig | 320 | 1.0 | 20 | 0.34 | Small |
| ② 400°C 8 mm jig | 400 | 1.8 | 13 | 0.33 | Present |
| ③ 400°C direct placement | 400 | 20 | 9.7 | 0.22 | Large |
| ④ 320°C direct placement | 320 | 20 | 13 | 0.28 | Present |

FIG. 13

| Conditions set | Before improvement | After improvement |
|---|---|---|
| PZT (100) diffraction intensity | 600-1000 cps | 1050-1350 cps |
| PZT (100) peak half-width | 0.24°-0.28° | 0.21°-0.22° |
| Zr/Ti composition gradient by ESCA | 10% or greater | 1.1% |
| Foreign matter in film | Large amount | Minimum amount |

DIELECTRIC FILM AND PIEZOELECTRIC ELEMENT

The entire disclosure of Japanese Patent Application Nos. 2005-104517 filed Mar. 31, 2005 and 2006-56096 filed Mar. 2, 2006 is expressly incorporated by reference herein.

BACKGROUND OF THE INVENTION

1. Field of the Invention

This invention relates to a dielectric film comprising a dielectric material including a piezoelectric material, a piezoelectric element, a liquid-jet apparatus, a method for producing a dielectric film, a method for producing a piezoelectric element having a piezoelectric film comprising a piezoelectric material, and a method for producing a liquid-jet head.

2. Description of the Related Art

A piezoelectric element used in a liquid-jet head, etc. is an element comprising a piezoelectric film sandwiched between two electrodes, the piezoelectric film comprising a piezoelectric material having an electromechanical conversion function. The piezoelectric film is composed of, for example, a crystallized piezoelectric ceramic.

An example of a liquid-jet head using such a piezoelectric element is an ink-jet recording head in which a portion of a pressure generating chamber communicating with a nozzle orifice for ejection of ink droplets is constituted of a vibration plate, and the vibration plate is deformed by the piezoelectric element to pressurize ink in the pressure generating chamber, thereby ejecting ink droplets from the nozzle orifice. Two types of ink-jet recording heads are put into practical use. One of them uses a piezoelectric actuator in a longitudinal vibration mode which expands and contracts in the axial direction of the piezoelectric element. The other uses a piezoelectric actuator in a flexural vibration mode. As the ink-jet recording head using the actuator in the flexural vibration mode, there is known, for example, an ink-jet recording head having a piezoelectric element which has been formed by forming a uniform piezoelectric layer over the entire surface of the vibration plate by a film-forming technology, and cutting the piezoelectric layer into forms corresponding to the pressure generating chambers by lithography to form the piezoelectric element independently for each pressure generating chamber.

The so-called sol-gel process is known as a method for producing the piezoelectric layer constituting the piezoelectric element. According to this method, a sol of an organometallic compound is coated on a substrate having a lower electrode formed thereon, followed by drying and gelling (degreasing) the coating to form a piezoelectric precursor film. This step of forming the precursor film is performed at least once. Then, the resulting precursor film is heat-treated at a high temperature for crystallization. These steps are repeated a plurality of times to prepare a piezoelectric layer (piezoelectric thin film) of a predetermined thickness.

The so-called MOD (metal-organic decomposition) method is known as another method for producing the piezoelectric layer constituting the piezoelectric element. This method generally comprises dissolving an organometallic compound, such as a metal alkoxide, in an alcohol, adding a hydrolysis inhibitor or the like to obtain a colloidal solution, coating the colloidal solution on a suitable material, then drying and sintering the coating to form the piezoelectric layer.

The conventional methods for producing the piezoelectric layer are disclosed, for example, on Japanese Patent Application Laid-Open No. 1997-223830 (pages 4 to 6) and Laid-Open No. 1994-005946. According to these methods, a piezoelectric layer of 1 µm or more in thickness can be formed relatively satisfactorily, and the occurrence of cracks can be prevented. However, the methods pose the problems that the crystalline state of the piezoelectric layer, such as the crystal grain size or orientation, is difficult to control, and a piezoelectric layer having desired characteristics is not obtained. Such problems are not limited to the piezoelectric film comprising the piezoelectric material for use in the piezoelectric element, etc. of the liquid-jet head, but are similarly encountered with dielectric films comprising other dielectric materials.

SUMMARY OF THE INVENTION

The present invention has been accomplished in the light of the above-mentioned circumstances. It is an object of the present invention to provide a dielectric film whose crystalline state is controlled relatively easily and which gives constantly stable characteristics, a method for producing the dielectric film, a method for producing a piezoelectric element, a method for producing a liquid-jet head capable of improving the characteristics of the piezoelectric element, and a liquid-jet apparatus.

A first aspect of the present invention for attaining the above object is a method for producing a dielectric film, comprising: a coating step of coating a colloidal solution containing an organometallic compound containing a metal constituting a dielectric film containing at least a lead component to form a dielectric precursor film; a drying step of drying the dielectric precursor film; a degreasing step of degreasing the dielectric precursor film; and a sintering step of sintering the dielectric precursor film to form a dielectric film, and wherein the drying step includes a first drying step of heating the dielectric precursor film to a temperature lower than a boiling point of a solvent, which is a main solvent of the material, and holding the dielectric precursor film at the temperature for a certain period of time to dry the dielectric precursor film, and a second drying step of drying the dielectric precursor film at a temperature in a range of 140° C. to 170° C., the degreasing step is performed at a degreasing temperature of 350° C. to 450° C. and at a heating-up rate of 15 [° C./sec] or higher, and the sintering step is performed at a heating-up rate of 100 [° C./sec] to 150 [° C./sec].

In the first aspect of the present invention, the drying step and the degreasing step narrow the distribution of the composition ratios of components other than lead constituting the dielectric film, and the sintering step decreases foreign matter. As a result, crystals of the dielectric film can be grown satisfactorily, and the dielectric film in the desired crystalline state can be formed. That is, the dielectric film having the proportions of the components at the B site distributed uniformly, and a small composition gradient is obtained.

A second aspect of the present invention is the method for producing a dielectric film according to the first aspect, characterized in that the dielectric film containing at least the lead component is lead zirconate titanate (PZT), and a distribution of a Zr/Ti composition in a film thickness direction is rendered less than 3%, when expressed as a value of a Zr/Ti composition gradient analyzed by ESCA, by the drying step, the degreasing step, and the sintering step.

In the second aspect of the present invention, a dielectric film having Zr/Ti uniformly distributed therein is obtained.

A third aspect of the present invention is the method for producing a dielectric film according to the first aspect, characterized in that the dielectric film containing at least the lead component is lead zirconate titanate (PZT), and a composition of the colloidal solution is such that a ratio of Pb:(Zr/Ti) is (1.10-1.20):1.00, and a ratio of Zr:Ti is (0.46-0.51):(0.54-0.49).

In the third aspect of the present invention, the proportion of Pb is set, and the ratio of Zr:Ti is set, whereby the amount of strain of the dielectric film can be ensured for a long term.

A fourth aspect of the present invention is the method for producing a dielectric film according to the first aspect, characterized in that the dielectric film containing at least the lead component is lead zirconate titanate (PZT), and a composition of the colloidal solution is such that a ratio of Pb:(Zr/Ti) is 1.18:1.00, and a ratio of Zr:Ti is (0.46-0.51):(0.54-0.49).

In the fourth aspect of the present invention, the ratio of Zr:Ti is set, whereby the amount of strain of the dielectric film can be ensured for a long term.

A fifth aspect of the present invention is the method for producing a dielectric film according to the first aspect, characterized in that the dielectric film containing at least the lead component is lead zirconate titanate (PZT), and a composition of the colloidal solution is such that a ratio of Pb:Zr:/Ti is 1.18:0.51-0.52:0.48-0.49.

In the fifth aspect of the present invention, the amount of strain and durability of the dielectric film exist together at a high level, whereby the amount of strain of the dielectric film can be ensured for a considerably long term.

A sixth aspect of the present invention is the method for producing a dielectric film according to any one of the first to fifth aspects, characterized in that in the sintering step, the dielectric precursor film is heated by an RTA method.

In the sixth aspect of the present invention, the dielectric precursor film can be rapidly heated at a desired heating-up rate by the RTA method.

A seventh aspect of the present invention is the method for producing a dielectric film according to any one of the first to sixth aspects, characterized in that crystals are preferred-oriented in a (100) plane of a rhombohedral system.

In the seventh aspect of the present invention, the orientation of crystals is controlled, whereby a dielectric film excellent in mechanical characteristics can be formed.

An eighth aspect of the present invention for attaining the above object is a method for producing a piezoelectric element, comprising the steps of: forming a lower electrode film above a substrate; forming a piezoelectric layer above the lower electrode film; and forming an upper electrode film above the piezoelectric layer, and wherein the step of forming the piezoelectric layer is a method for producing the dielectric film produced by the producing method according to any one of the first to seventh aspects.

In the eighth aspect of the present invention, crystals of the dielectric film grow satisfactorily, thus making it possible to obtain a piezoelectric element having a piezoelectric layer comprising a dielectric film in a desired crystalline state.

A ninth aspect of the present invention for attaining the above object is a method for producing a liquid-jet head, which uses the piezoelectric element produced by the producing method according to the eighth aspect.

In the ninth aspect of the present invention, it is possible to obtain a liquid-jet head furnished with a piezoelectric element having a piezoelectric layer comprising a dielectric film in a desired crystalline state.

A tenth aspect of the present invention for attaining the above object is a dielectric film in which a distribution of a Zr/Ti composition in a film thickness direction of lead zirconate titanate (PZT) is rendered less than 3% when expressed as a value of a Zr/Ti composition gradient analyzed by ESCA.

In the tenth aspect of the present invention, a dielectric film having Zr/Ti uniformly distributed therein is obtained.

An eleventh aspect of the present invention for attaining the above object is a piezoelectric element comprising a lower electrode film formed above a substrate, the dielectric film according to the tenth aspect provided as a layer above the lower electrode film, and an upper electrode film formed above the dielectric film as the layer.

In the eleventh aspect of the present invention, a piezoelectric element having, as a piezoelectric layer, a dielectric film having Zr/Ti uniformly distributed therein is obtained.

A twelfth aspect of the present invention for attaining the above object is a liquid-jet apparatus including a liquid-jet head having the piezoelectric element according to the eleventh aspect as a drive source for ejecting liquid droplets through nozzle orifices.

In the twelfth aspect of the present invention, it is possible to obtain a liquid-jet apparatus furnished with a piezoelectric element having, as a piezoelectric layer, a dielectric film having Zr/Ti uniformly distributed therein.

BRIEF DESCRIPTION OF THE DRAWINGS

For a more complete understanding of the present invention and the advantages thereof, reference is now made to the following descriptions in conjunction with the accompanying drawings.

FIG. 8 is a tabular view illustrating the dependence of PZT crystallinity on the degreasing conditions.

FIG. 13 is a tabular view showing the results of improvement of heat treatment conditions.

DESCRIPTION OF THE PREFERRED EMBODIMENTS

The present invention will now be described in detail based on the embodiments offered below.

Embodiment 1

Figure 1:
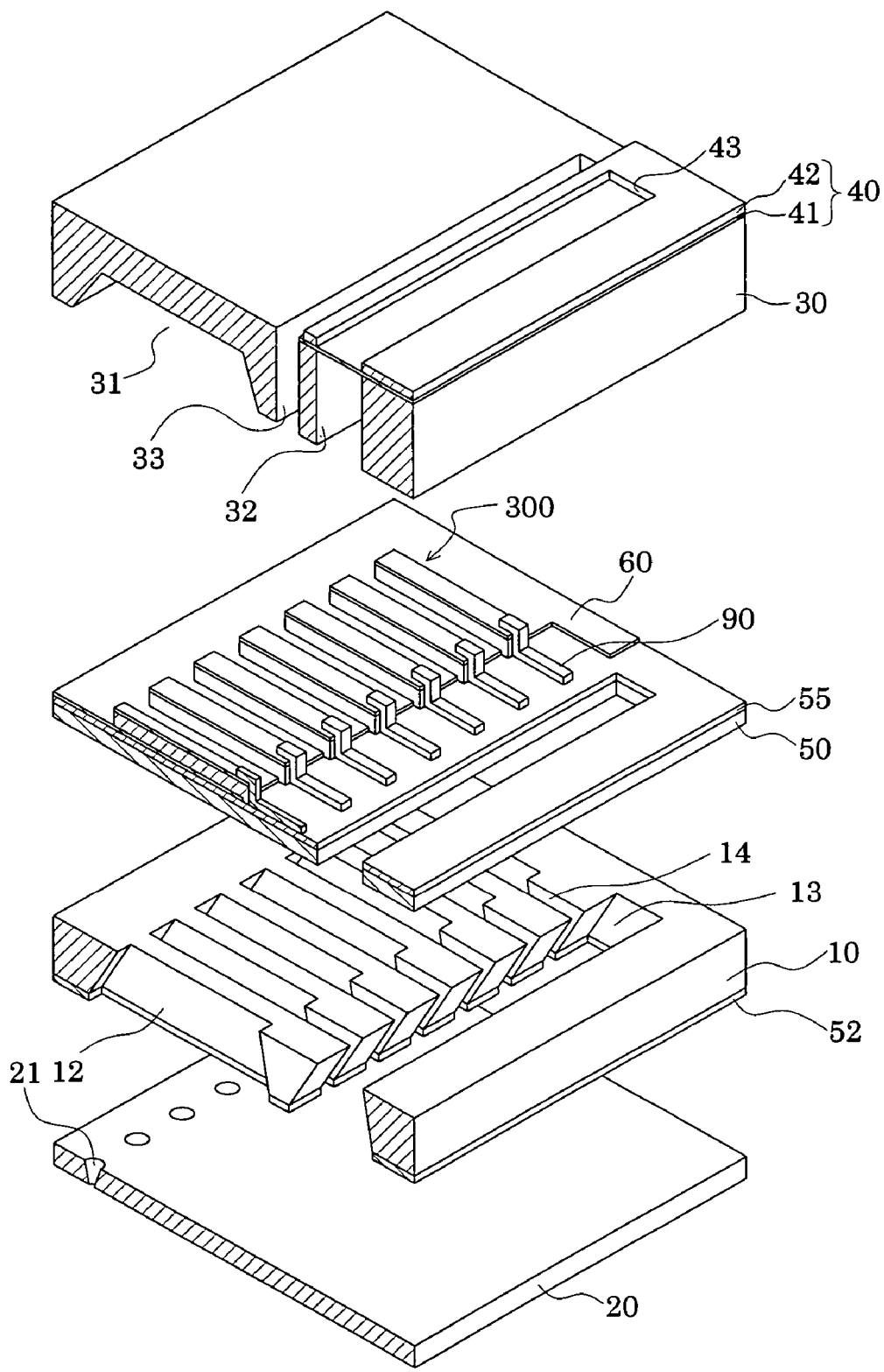
FIG. 1 is an exploded perspective view of a recording head according to Embodiment 1.
Figure 2A:
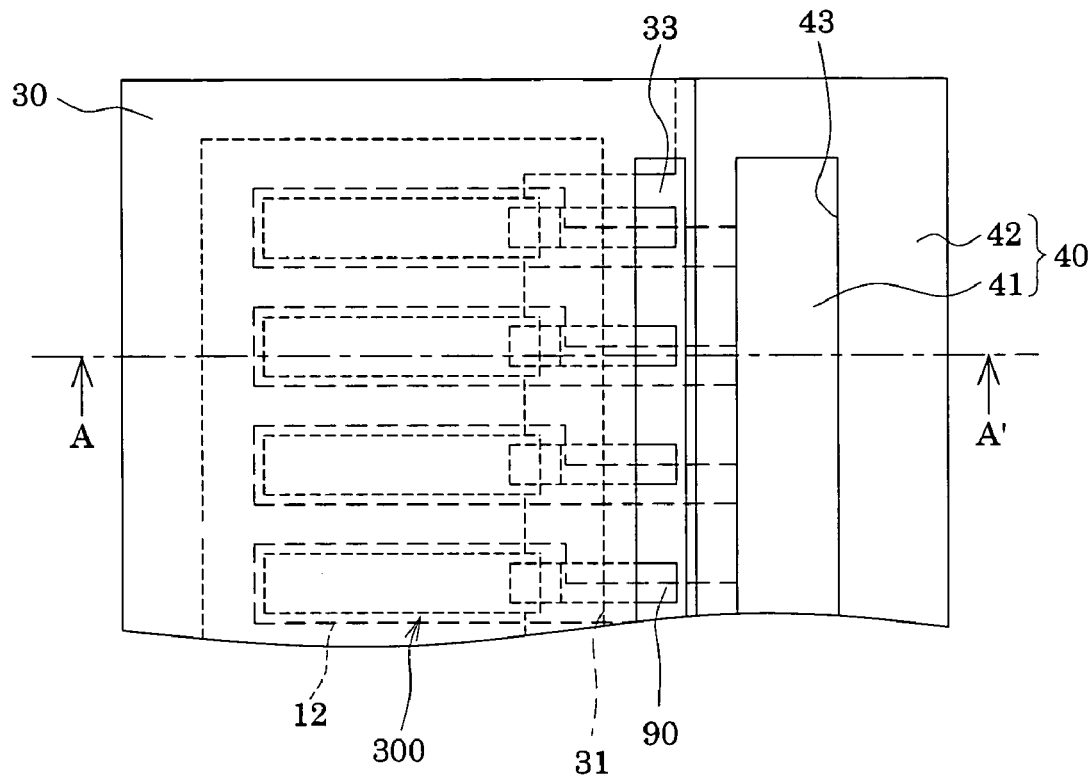
FIGS. 2A and 2B are, respectively, a plan view and a sectional view of the recording head according to Embodiment 1.
Figure 2B:
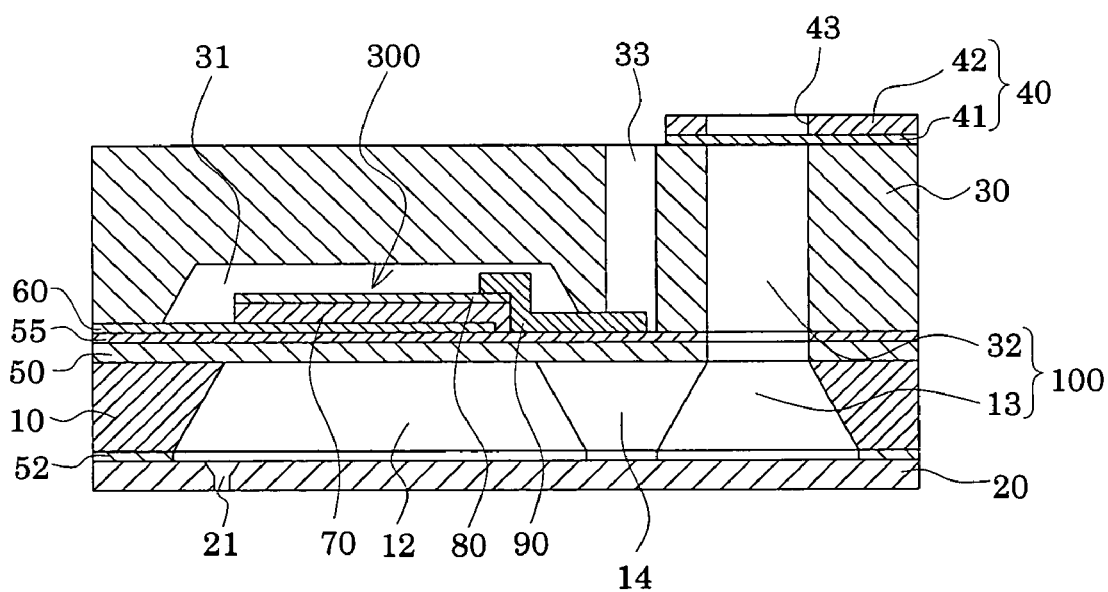

FIG. 1 is an exploded perspective view showing an ink-jet recording head according to Embodiment 1 of the present invention. FIG. 2A and FIG. 2B are a plan view and a sectional view, respectively, of the ink-jet recording head in FIG. 1. As illustrated in these drawings, a passage-forming substrate 10, in the present embodiment, consists of a single crystal silicon substrate having a plane (110) of the plane orientation. A 0.5 to 2 µm thick elastic film 50, composed of silicon dioxide formed beforehand by thermal oxidation, is formed on one surface of the passage-forming substrate 10. In the passage-forming substrate 10, a plurality of pressure generating chambers 12 a rearranged parallel in the width direction thereof. A communicating portion 13 is formed in a region of the passage-forming substrate 10 longitudinally outward of the pressure generating chambers 12, and the communicating portion 13 and each pressure generating chamber 12 are brought into communication via an ink supply path 14 provided for each pressure generating chamber 12. The communicating portion 13 communicates with a reservoir portion of a protective plate (to be described later) to constitute a reservoir serving as a common ink chamber for the respective pressure generating chambers 12. The ink supply path 14 is formed in a smaller width than that of the pressure generating chamber 12 to keep constant the passage resistance of ink flowing from the communicating portion 13 into the pressure generating chamber 12.

Onto the opening surface of the passage-forming substrate 10, a nozzle plate 20 having nozzle orifices 21 bored therein is secured via an adhesive agent or a heat sealing film. The nozzle orifices 21 communicate with near-end portions of the pressure generating chambers 12 on the side opposite to the ink supply paths 14. The nozzle plate 20 comprises a glass ceramic, a single crystal silicon substrate, or stainless steel having a thickness of, for example, 0.01 to 1 mm, and a linear expansion coefficient of, for example, 2.5 to 4.5 $[\times 10^{-6}/° C.]$ at 300° C. or below.

On the side of the passage-forming substrate 10 opposite to its opening surface, the elastic film 50 comprising silicon dioxide ($SiO_2$) and having a thickness, for example, of about 1.0 µm is formed, as described above. An insulation film 55 comprising zirconium oxide ($ZrO_2$) and having a thickness, for example, of about 0.4 µm is formed on the elastic film 50. On the insulation film 55, a lower electrode film 60 with a thickness, for example, of about 0.2 µm, a piezoelectric layer 70 with a thickness, for example, of about 1.0 µm, and an upper electrode film 80 with a thickness, for example, of about 0.05 µm are formed in a laminated state by a process (to be described later) to constitute a piezoelectric element 300. The piezoelectric element 300 refers to a portion including the lower electrode film 60, the piezoelectric layer 70, and the upper electrode film 80. Generally, one of the electrodes of the piezoelectric element 300 is used as a common electrode, and the other electrode and the piezoelectric layer 70 are constructed for each pressure generating chamber 12 by patterning. A portion, which is composed of any one of the electrodes and the piezoelectric layer 70 that have been patterned, and which undergoes piezoelectric strain upon application of voltage to both electrodes, is called a piezoelectric active portion. In the present embodiment, the lower electrode film 60 is used as the common electrode for the piezoelectric elements 300, while the upper electrode film 80 is used as an individual electrode of each piezoelectric element 300. However, there is no harm in reversing their usages for the convenience of a drive circuit or wiring. In either case, it follows that the piezoelectric active portion is formed for each pressure generating chamber 12. Herein, the piezoelectric element 300 and a vibration plate, where strain occurs by a drive of the piezoelectric element 300, are referred to collectively as a piezoelectric actuator. A lead electrode 90 comprising, for example, gold (Au) is connected to the upper electrode film 80 of each piezoelectric element 300. Voltage is applied selectively to each piezoelectric element 300 via the lead electrode 90.

The material for the piezoelectric layer 70 constituting the piezoelectric element 300 may be, for example, a ferroelectric piezoelectric material such as lead zirconate titanate (PZT), or a relaxor ferroelectric having a metal, such as niobium, nickel, magnesium, bismuth or yttrium, added to such a ferroelectric piezoelectric material. The composition of the piezoelectric layer 70 may be chosen, as appropriate, in consideration of the characteristics, uses, etc. of the piezoelectric element 300. Its examples are $PbTiO_3$ (PT), $PbZrO_3$ (PZ), $Pb(Zr_xTi_{1-x})O_3$ (PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/2}Ta_{1/2})O_3$—$PbTiO_3$ (PST-PT), $Pb(Sc_{1/2}Nb_{1/2})O_3$—$PbTiO_3$ (PSN-PT), $BiScO_3$—$PbTiO_3$ (BS-PT), and $BiYbO_3$—$PbTiO_3$ (BY-PT).

A protective plate 30 having a piezoelectric element holding portion 31, which can ensure in a region opposed to the piezoelectric elements 300 such a space as not to impede the movement of the piezoelectric elements 300, is joined onto a surface of the passage-forming substrate 10 where the piezoelectric elements 300 have been formed. Since the piezoelectric elements 300 are formed within the piezoelectric element holding portion 31, they are protected in a state nearly free from the influence of an external environment. In the protective plate 30, a reservoir portion 32 is provided in a region corresponding to the communicating portion 13 of the passage-forming substrate 10. The reservoir portion 32, in the present embodiment, is formed so as to penetrate the protective plate 30 in its thickness direction and extend along the parallel arrangement direction of the pressure generating chambers 12. The reservoir portion 32, as described earlier, is brought into communication with the communicating portion 13 of the passage-forming substrate 10 to constitute a reservoir 100 which serves as the common ink chamber for the respective pressure generating chambers 12.

A through-hole 33, which penetrates the protective plate 30 in its thickness direction, is provided in a region of the protective plate 30 between the piezoelectric element holding portion 31 and the reservoir portion 32. Within the through-hole 33, a part of the lower electrode film 60 and a front end portion of the lead electrode 90 are exposed, and an end of connection wiring extending from a drive IC (not shown) is connected to the lower electrode film 60 and the lead electrode 90.

The material for the protective plate 30 is, for example, glass, a ceramic material, a metal, or a resin. More preferably, however, the protective plate 30 is formed from a material having nearly the same thermal expansion coefficient as that of the material for the passage-forming substrate 10. In the present embodiment, the protective plate 30 is formed using a single crystal silicon substrate which is the same material as the material for the passage-forming substrate 10.

Furthermore, a compliance plate 40, which consists of a sealing film 41 and a fixing plate 42, is joined onto the protective plate 30. The sealing film 41 comprises a low rigidity, flexible material (for example, a polyphenylene sulfide (PPS) film of 6 µm in thickness), and the sealing film 41 deals one surface of the reservoir portion 32. The fixing plate 42 is formed from a hard material such as a metal (for example, stainless steel (SUS) of 30 µm in thickness). A region of the fixing plate 42 opposed to the reservoir 100 defines an opening portion 43 completely deprived of the plate in the thickness direction. Thus, one surface of the reservoir 100 is sealed only with the sealing film 41 having flexibility.

With the ink-jet recording head of the present embodiment described above, ink is taken in from an external ink supply means (not shown), and the interior of the head ranging from the reservoir 100 to the nozzle orifices 21 is filled with the ink. Then, according to recording signals from the drive IC (not shown), voltage is applied between the lower electrode film 60 and the upper electrode film 80 corresponding to the pressure generating chamber 12 to flexibly deform the elastic film 50, the insulation film 55, the lower electrode film 60 and the piezoelectric layer 70. As a result, the pressure inside the pressure generating chamber 12 rises to eject ink droplets through the nozzle orifice 21.

Figure 3A:
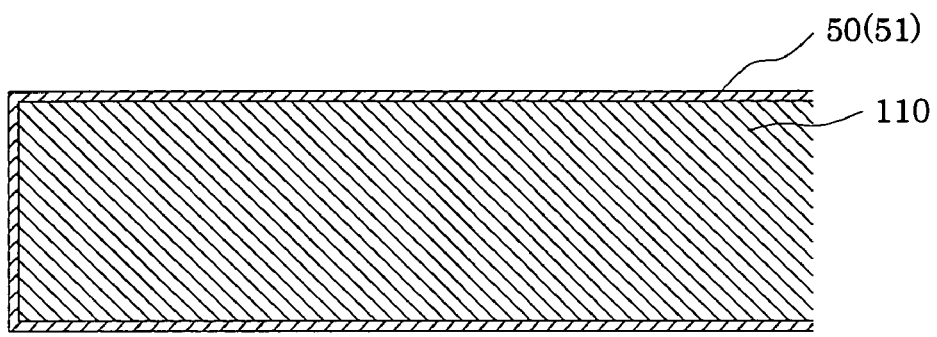
FIGS. 3A to 3D are sectional views showing a manufacturing process for the recording head according to Embodiment 1.

The method for producing the above-described ink-jet recording head will be described with reference to FIGS. 3A to 3D through FIGS. 4A to 4C. FIGS. 3A to 3D and 4A to 4C are sectional views in the longitudinal direction of the pressure generating chamber 12. Firstly, as shown in FIG. 3A, a passage-forming substrate wafer 110, which is a silicon wafer, is thermally oxidized in a diffusion furnace at about 1,100° C. to form a silicon dioxide film 51 constituting the elastic film 50 on the surface of the wafer 110. In the present embodiment, a silicon wafer having a relatively large thickness of about 625 µm and having high rigidity is used as the passage-forming substrate 10.

Figure 3B:
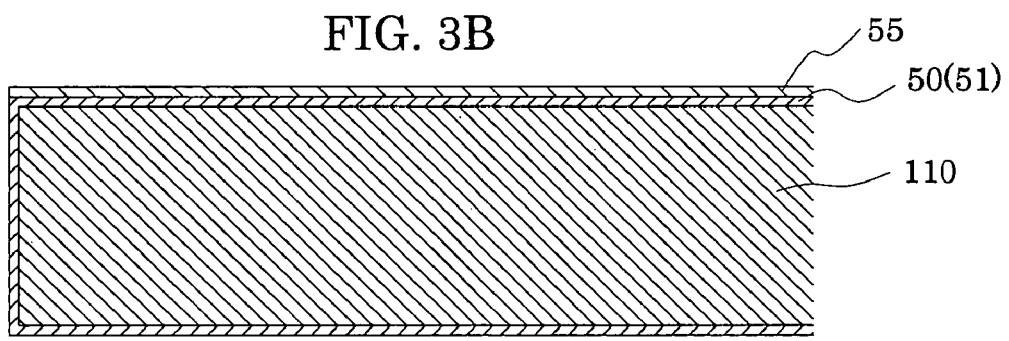
Figure 3C:
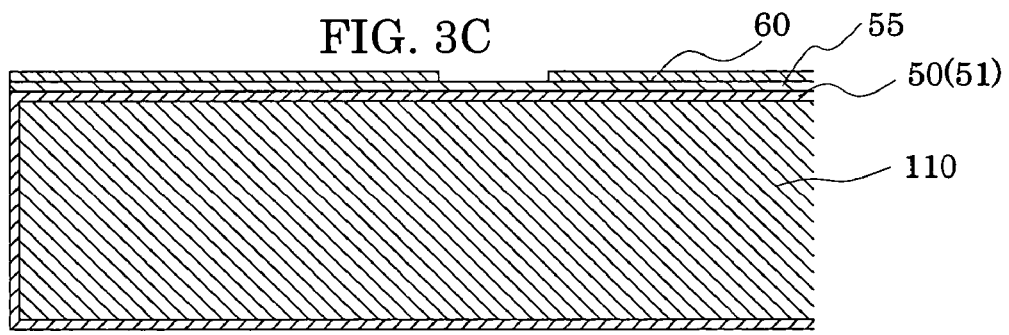

Then, as shown in FIG. 3B, the insulation film 55 comprising zirconium oxide is formed on the elastic film 50 (silicon dioxide film 51). Concretely, a zirconium layer is formed on the elastic film 50 by DC sputtering, and then the zirconium layer is thermally oxidized to form the insulation film 55 comprising zirconium oxide. Then, as shown in FIG. 3C, platinum (Pt) and iridium (Ir), for example, are stacked on the insulation film 55 to form the lower electrode film 60, whereafter the lower electrode film 60 is patterned into a predetermined shape.

Figure 3D:
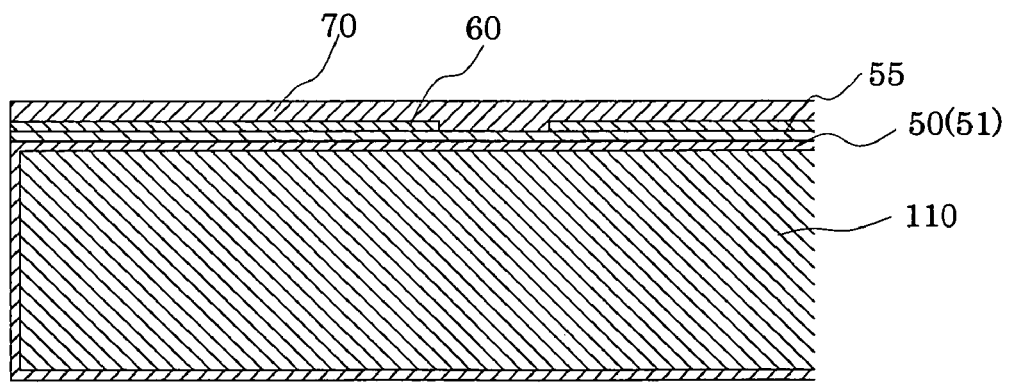

Then, as shown in FIG. 3D, the piezoelectric layer 70 comprising, for example, lead zirconate titanate (PZT) is formed. In the present embodiment, a so-called sol comprising a metal organic material dissolved or dispersed in a catalyst is coated and dried to be gelled, and is further fired at a high temperature to obtain the piezoelectric layer 70 comprising a metal oxide. That is, the piezoelectric layer 70 is formed by the sol-gel process.

The material for the piezoelectric layer 70 is not limited to lead zirconate titanate, and may be, for example, a piezoelectric material other than relaxor ferroelectrics (for example, PMN-PT, PZN-PT, PNN-PT). The method for forming the piezoelectric layer 70 is not limited to the sol-gel process. For example, the MOD (metal-organic decomposition) method may be used.

Figure 4A:
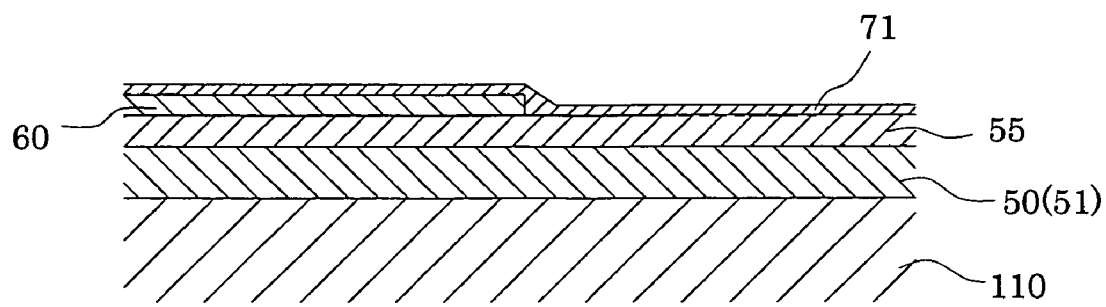
FIGS. 4A to 4C are sectional views showing the manufacturing process for the recording head according to Embodiment 1.

A concrete procedure for forming the piezoelectric layer 70 begins with forming a piezoelectric precursor film 71, which is a PZT precursor film, above the lower electrode film 60, as shown in FIG. 4A. That is, a sol (solution) containing a metal organic compound is coated above the passage-forming substrate 10 above which the lower electrode film 60 has been formed (a coating step). Then, the piezoelectric precursor film 71 is heated from room temperature to a temperature lower than the boiling point of a solvent, which is a main solvent of the sol, and dried for a certain period of time to evaporate the solvent of the sol, thereby drying the piezoelectric precursor film 71 (a first drying step).

The main solvent of the sol is not limited, but it is preferred to use, for example, an ethanol-based solvent. In the present embodiment, 2-n-butoxyethanol having a boiling point of 176° C. is used. In the present embodiment, therefore, the coated sol is heated at a temperature lower than 176° C. as the boiling point of the solvent, for example, at about 140° C., and held at this temperature for a time of the order of 3 minutes in the first drying step to dry the piezoelectric precursor film 71.

Then, the piezoelectric precursor film 71 is heated again to a temperature higher than that during the first drying step, for example, in the present embodiment, and held at this temperature for a certain time to evaporate the main solvent of the sol further, thereby drying the piezoelectric precursor film 71 (a second drying step). The temperature reached in the second drying step is set at 140° C. to 170° C. The drying time is preferably of the order of 5 to 50 minutes.

A heating device used in such drying steps is, for example, a clean oven (diffusion furnace), or a baking device. The use of a baking device, in particular, is preferred, because with the clean oven, the temperature is controlled by applying hot air, so that the characteristics of the piezoelectric precursor film tend to vary in the planar direction of the passage-forming substrate wafer.

After the piezoelectric precursor film 71 is dried by the above-mentioned first and second drying steps, the piezoelectric precursor film 71 is degreased for a certain time at a certain temperature in the air atmosphere (a degreasing step). Degreasing refers to releasing the organic components of the sol film, for example, as $NO_2$, $CO_2$ and $H_2O$.

The method of heating in the degreasing step is not limited, but in the present embodiment, the passage-forming substrate wafer is placed on a hot plate to raise the temperature of the piezoelectric precursor film 71 to a predetermined temperature. In decreasing the rate of temperature raising (i.e., the heating-up rate), the passage-forming substrate wafer 110 is heated via a jig which is an aluminum plate having a predetermined thickness and having a slightly larger outer diameter than that of the wafer. The degreasing temperature in the degreasing step is set at a temperature in the range of 350° C. to 450° C. If the temperature is too high, crystallization begins. If the temperature is too low, the distribution of the Zr/Ti composition is wide. The degreasing step is preferably performed for 10 minutes or longer.

In order to improve the crystallinity of the piezoelectric layer, the heating-up rate in the degreasing step is important. Concretely, the heating-up rate in the degreasing step is set at 15 [° C./sec] or higher. By so doing, the (100) orientation intensity of the piezoelectric layer can be increased, and the distribution of the composition ratio of the components other than lead which constitute the piezoelectric layer, for example, the distribution of the Zr/Ti composition, can be decreased.

The "heating-up rate" referred to herein is defined as follows: Heating begins when the temperature is room temperature, and ends when a certain temperature is reached. The rate of change in temperature over time is determined based on a period from a time when the temperature rises from room temperature by 20% of the temperature difference between room temperature and the temperature reached, until a time when the temperature becomes 80% of the temperature difference. For example, assume that the temperature is raised from room temperature (25° C.) to 100° C. over the course of 50 seconds. The heating-up rate in this case is $(100-25) \times (0.8-0.2)/50 = 0.9$ [° C./sec].

Figure 4B:
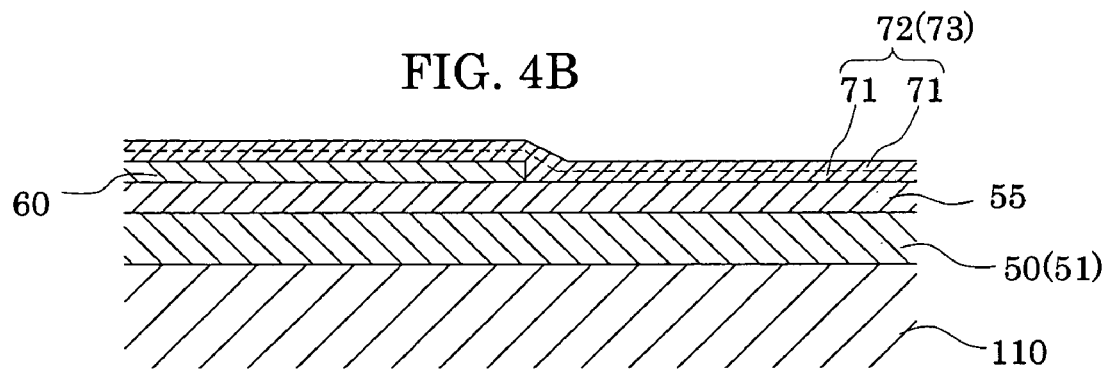

The coating step, the first drying step, the second drying step, and the degreasing step described above are repeated a predetermined number of times, for example, twice in the present embodiment. As a result, the piezoelectric precursor film 72 of a predetermined thickness is formed, as shown in FIG. 4B. In the present embodiment, the coating step, the first drying step, the second drying step, and the degreasing step are repeated twice to form the piezoelectric precursor film 72 of a predetermined thickness. However, it goes without saying that the number of repeats is not limited to 2, but may be one or three or more.

Then, the piezoelectric precursor film 72 of a predetermined thickness is heat-treated for crystallization to form the piezoelectric film 73 (a sintering step). The sintering conditions differ according to the material. In the present embodiment, for example, the piezoelectric precursor film 72 is fired by heating at 680° C. or above for 5 to 30 minutes, whereby the piezoelectric film 73 is formed. An RTA (rapid thermal annealing) device is used as the heating device, and the heating-up rate in the sintering step is set at 100 [° C./sec] to 150 [° C./sec] to perform rapid heating. Since the heating-up rate is set at 100 [° C./sec] to 150 [° C./sec] for rapid heating, foreign matter in the film is decreased.

Figure 4C:
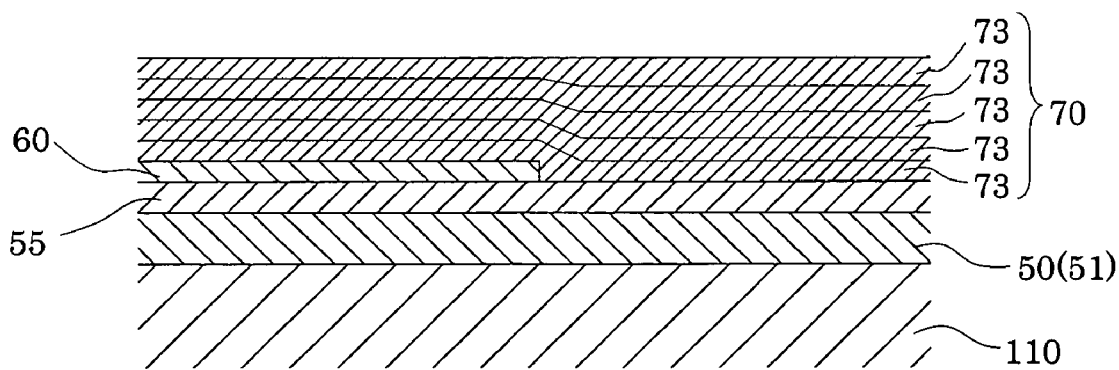

The coating step, the first and second drying steps, the degreasing step, and the sintering step described above are repeated a plural number of times, whereby the piezoelectric layer 70 of a predetermined thickness consisting of a plurality of (5 in the present embodiment) the piezoelectric films 73 is formed, as shown in FIG. 4C. If the film thickness per coating of the sol is of the order of 0.1 μm, for example, the total film thickness of the piezoelectric layer 70 is about 1 μm.

The composition of the sol coated in the coating step will be described below.

The composition of the sol needs to be one such as to optimize the amount of strain and durability, namely, the strain decrease rate, of the piezoelectric layer 70. In the present embodiment, the sol having the Pb:Zr:Ti composition represented by 1.18:0.51-0.52:0.48-0.49 is used in order to form the piezoelectric layer 70 comprising lead zirconate titanate (PZT). By using the sol having this composition, a sufficient amount of strain for ink ejection can be ensured, and the decrease rate of strain upon repeated strain can be kept minimal.

A pulse durability test was conducted on an actuator using the sol having the Pb Zr:Ti composition ratio of 1.18:0.51-0.52:0.48-0.49. For example, durability was examined when the initial strain was 360 nm, and a pulse of 35V was applied repeatedly. It was confirmed that even upon application of 10,000 million pulses, an amount of strain of 320 nm posing no problem in practical use could be ensured.

Durability was also examined when the initial strain was 400 nm, and a pulse of 35V was applied repeatedly with the use of the sol having the Pb:Zr:Ti composition ratio of 1.18:0.46:0.54. Upon application of less than 10,000 million pulses, the amount of strain decreased to 320 nm or smaller. However, no harm is done to durability at about several hundred million pulses to 3,000 million pulses, the applied pulse number for a liquid-jet apparatus used in ordinary households.

Figure 17:
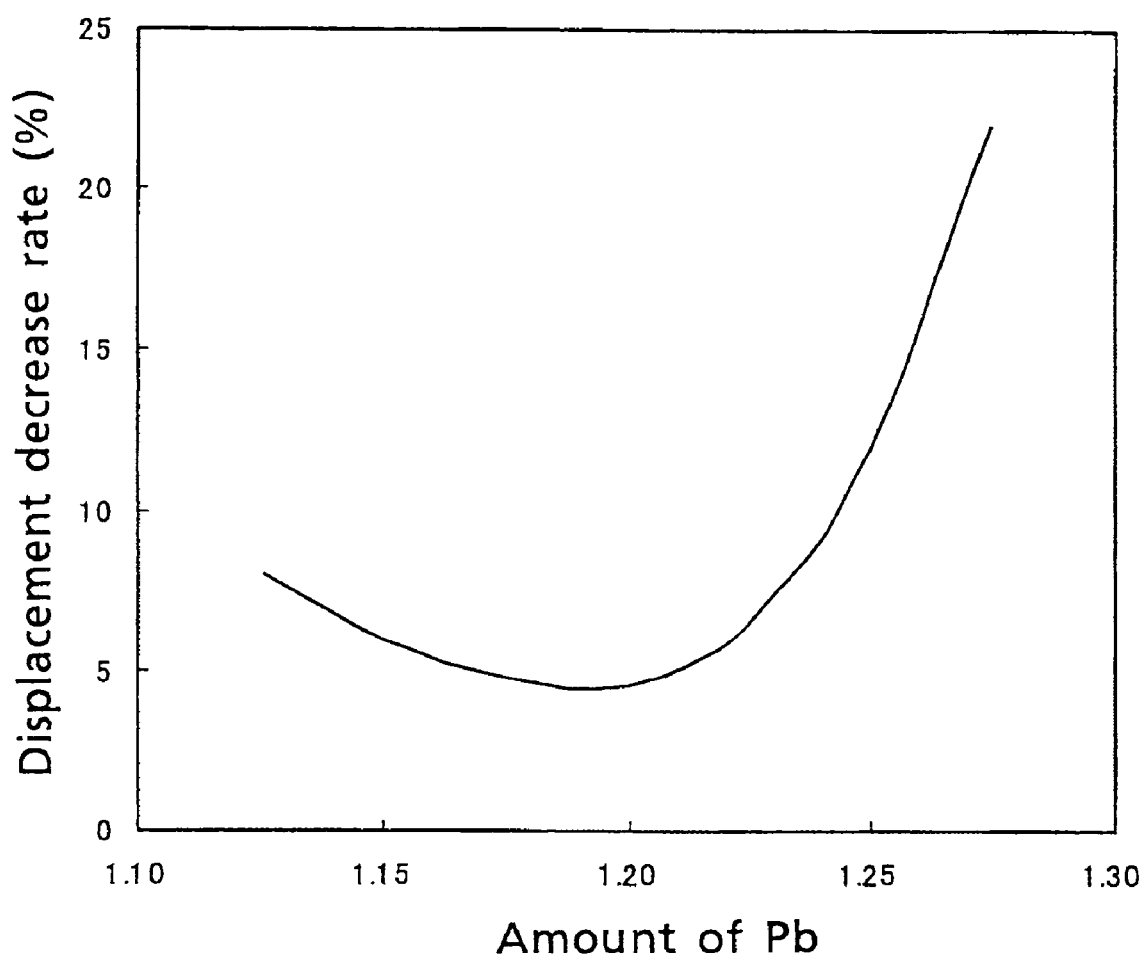
FIG. 17 is a graph showing the relationship between the amount of Pb and the decrease rate of strain.

The results of investigation into the relationship between the amount of Pb and the decrease rate of strain are described based on FIG. 17 which is a graph illustrating this relationship. The decrease rate of strain is desired to be 10% or less from the point of view of reliability. The status of a decrease in strain was tested, with the ratio of Pb to (Zr/Ti) being changed. As shown in FIG. 17, the minimum value of the strain decrease rate (%) exists (little decrease in strain occurs) when the ratio of Pb is between 1.14 and 1.21. At the Pb ratio of 1.18, the strain decrease rate takes the minimum value less than 5%. Thus, the composition ratio of Pb:(Zr/Ti) is found to be preferably set at (1.10-1.20):1.00, especially 1.18:1.00. Based on these results, the ratio of Pb:(Zr/Ti) is set at 1.18:1.00 in the present embodiment. The composition ratio of Pb:(Zr/Ti) can be set in the range of (1.10-1.20):1.00.

Next, the relationship between the Zr/Ti ratio and the strain decrease rate will be described. The strain decrease rate versus the Zr/Ti ratio is also desired to be 10% or less from the viewpoint of reliability. When the Zr/Ti ratio was (0.46-0.51)/(0.54-0.49), the amount of initial strain was 360 nm or more, and the strain decrease rate was 10% or less.

Based on these results, in the present embodiment, the composition ratio of Pb:(Zr/Ti) can be set at 1.18:1.00, and the composition ratio of Zr:Ti can be set in the range of (0.46-0.51):(0.54-0.49).

The relationship between the Zr/Ti ratio and the strain factor will be described. The strain factor refers to a value obtained by subtracting the length (l) of an object in zero electric field from the length (l') of the object extended upon application of a predetermined electric field, and dividing the resulting difference (Δl) by l. A greater strain factor means a larger amount of initial strain. The strain factor at 230 kV/cm (film thickness 1.1 μm 23V) took the highest value at Zr/Ti in the vicinity of 51-52/48-49. The amount of initial strain was about 400 nm, The strain decrease rate at the Zr/Ti ratio of 51-52/48-49 can be kept down to 5% or less.

Based on the above results, the use of the sol having the Pb:Zr:Ti composition ratio of 1.18:(0.51-0.52):(0.48-0.49) makes it possible to achieve the curtailment of the strain decrease rate and the ensuring of a high amount of initial strain.

As described above, the method of producing the dielectric film (piezoelectric layer 70) of the present embodiment includes the coating step of coating a colloidal solution containing an organometallic compound containing a metal constituting a dielectric film containing at least a lead component to form a dielectric precursor film, the drying step of drying the dielectric precursor film, the degreasing step of degreasing the dielectric precursor film, and the sintering step of sintering the dielectric precursor film to form a dielectric film, and wherein the drying step includes the first drying step of heating the dielectric precursor film at a temperature lower than the boiling point of a solvent, which is a main solvent of the above-mentioned material, and holding the dielectric precursor film at this temperature for a certain period of time to dry the dielectric precursor film, and the second drying step of drying the dielectric precursor film at a temperature in the range of 140° C. to 170° C., the degreasing step is performed at a degreasing temperature of 350° C. to 450° C. and at a heating-up rate of 15 [° C./sec] or higher, and the sintering step is performed at a heating-up rate of 100 [° C./sec] to 150 [° C./sec].

The drying step and the degreasing step narrow the distribution of the Zr/Ti composition, and the sintering step decreases foreign matter, so that the crystals of the dielectric film grow satisfactorily, and the dielectric film in the desired crystalline state can be formed. That is, a PZT film having Zr/Ti at the B site uniformly distributed therein is obtained. Here, if the composition of the piezoelectric layer having the lead component is expressed as ABOx, lead is indicated at the A site, and components other than the component at the A site are indicated at the B site.

According to the drying step and the degreasing step, the distribution of the Zr/Ti composition in the film thickness direction is rendered less than 3% when expressed as a value in the Zr/Ti composition gradient analyzed by ESCA. By so doing, a PZT film having Zr/Ti uniformly distributed therein is obtained. In the sintering step, the dielectric precursor film is heated by the RTA method. The RTA method can rapidly heat the dielectric precursor film at 100 [° C./sec] to 150 [° C./sec] which is the desired heating-up rate. As a result, the crystals can be preferred-oriented in the (100) plane of a rhombohedral system, and a dielectric film having excellent mechanical characteristics can be formed.

Hence, the present invention provides a method for producing a dielectric film whose crystalline state is controlled relatively easily to obtain constantly stable characteristics.

The following is an explanation for setting of the conditions for drying at a temperature of 140° C. to 170° C. which are the temperature conditions for the second drying step; the conditions for degreasing at 350° C. to 450° C. and degreasing at a heating-up rate of 15 [° C./sec] or higher, which are the temperature conditions for the degreasing step; the conditions for sintering at 100 [° C./sec] to 150 [° C./sec] which is the heating-up rate for the sintering step.

The ideal shape of PZT is such that the directions of polarizations in any regions should make the same angle with respect to the electric field, and these directions should be different from the direction of the electric field (namely, the entire film has to fulfill the definition of the engineered domain). For this purpose, the following requirements need to be fulfilled.

I. The composition ratio of Zr/Ti should be uniform in the entire film, because the crystal system and the direction of polarization differ according to the Zr/Ti ratio.

(i) Analysis by ESCA . . . According to ESCA (electron spectroscopy of chemical analysis), the energy distribution of photoelectrons released upon X-ray irradiation of the surface of a sample is measured to give knowledge of the composition of the sample. Since the analysis of not only the outermost surface, but also regions in the depth direction can be made by etching with Ar ions, the Zr/Ti distribution in the film thickness direction can be investigated.

(ii) Measurement by XRD . . . The lattice constant of PZT crystals depends on the Zr/Ti composition ratio. Since the lattice constant is greater on the Zr-rich side, XRD peaks appear on the low-angle side. If variations in the Zr/Ti distribution are great within the PZT film (the film is divided into a Zr-rich region and a Ti-rich region), the lattice constant of PZT is distributed somewhat widely, so that the half-width of the diffraction peak of PZT is broad. The present embodiment targets a uniform distribution of Zr/Ti, and thus prefers a narrow PZT (100) diffraction peak.

II. The film should be completely crystalline and free from phases. Observation of a section of the film based on its TEM image or SEM image may show foreign matter within the film. In this case, the foreign matter is assumed to be low-density layers or vacancies. Such a film is not the desired completely crystalline film, and the foreign matter does not contribute to piezoelectric characteristics, but deteriorates the piezoelectric characteristics.

The heat treatment conditions for the PZT sol that fulfill the above requirements I and II were investigated. Brief outlines of the steps are as follows:

a. Coating of sol
   b. Drying step 1: 140° C., 3 min
   c. Drying step 2
   d. Degreasing step
   e. Sintering step (crystallization of sol)

1. Conditions for the Degreasing Step

Figure 5:
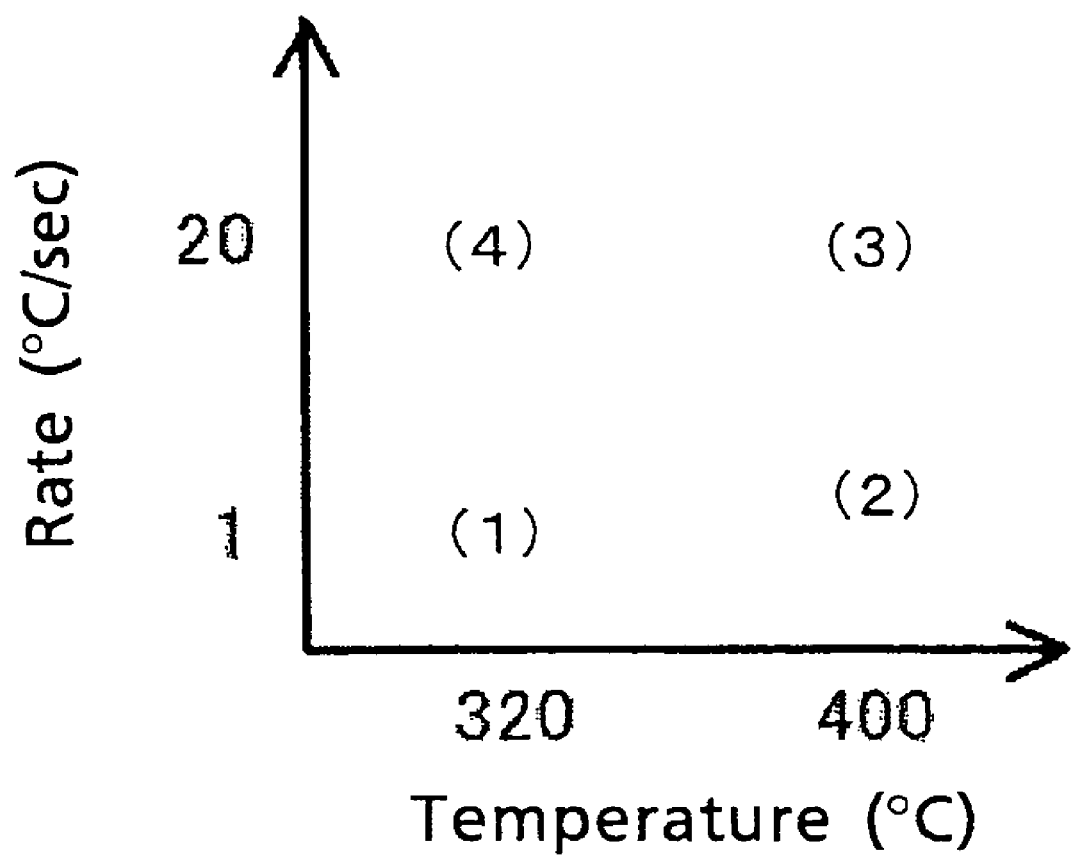
FIG. 5 is a matrix diagram of degreasing conditions.

The dependence of the Zr/Ti distribution and the amount of foreign matter on the degreasing conditions was investigated. Matrices ((1) to (4)) representing the relationship between the heating-up rate and the temperature, as shown in FIG. 5, were constructed, as samples, to look into differences in the Zr/Ti distribution and the amount of foreign matter according to the temperature and heating-up rate of degreasing. The temperatures reached were 320° C. and 400° C., and the heating-up rate was adjusted according the presence or absence of a degreasing jig. (The conditions for the first drying step and the conditions for the second drying step were 140° C., 3 minutes, and 170° C., 20 minutes, respectively, while the conditions for the sintering step were fixed at 700° C., 30 minutes in a diffusion furnace.)

Figure 6:
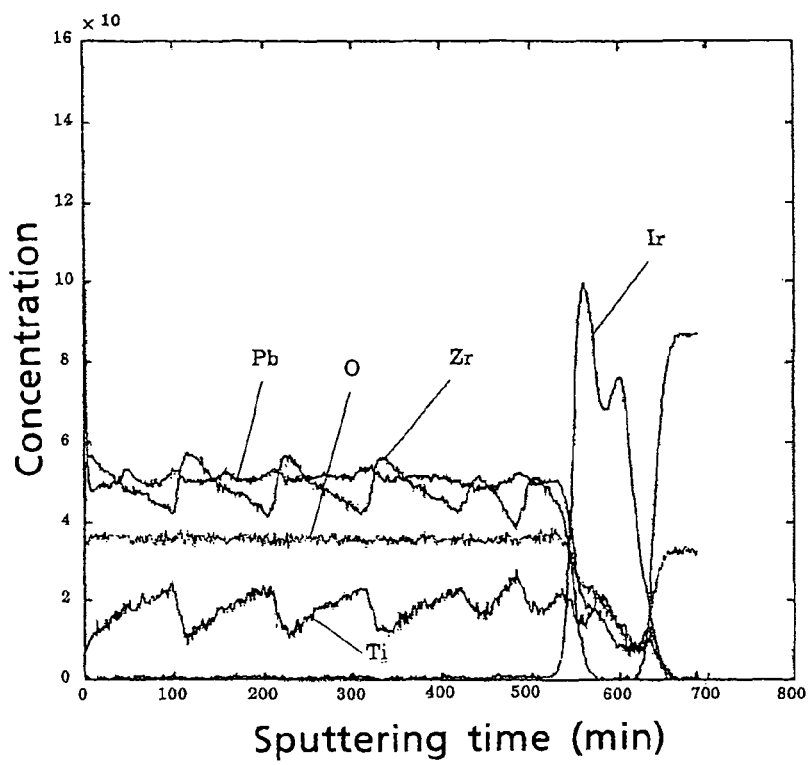
FIGS. 6A and 6B are views showing the depth profiles of piezoelectric layers.
Figure 6:
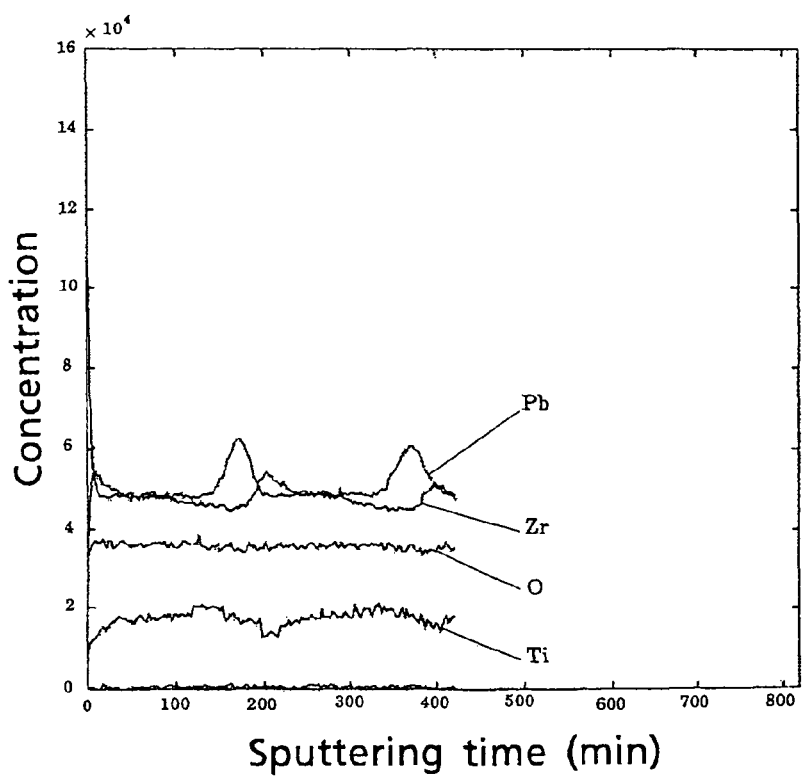

The Zr/Ti composition gradient due to nonuniform distribution of Zr/Ti was examined by ESCA. The sample (1) corresponded to the presence of the jig at 320° C., and the sample (3) corresponded to direct placement, without the jig, at 400° C. The results are shown in FIGS. 6A and 6B, which represent concentration distributions in the depth direction (depth profiles) obtained with the samples (1) and (3). FIG. 6A offers the results with the sample (1), showing that variations occurred in the concentrations of titanium (Ti) and zirconium (Zr), in the depth direction of the piezoelectric layer, of the PZT components constituting the piezoelectric element. FIG. 6B offers the results with the sample (3), showing that variations, in the depth direction of the piezoelectric layer, in the concentrations of the PZT components constituting the piezoelectric element were smaller than those of the sample (1), namely, that the composition gradient was greater in the sample (1).

The composition gradient was defined in the following manner for its quantitative evaluation: Attention was paid to Zr in the ESCA depth profile, and the moving averages of its intensity data were taken at 5 time points. The maximum value (Max) and the minimum value (Min) of the measured intensity were described from the measured numerical data on the PZT layer. The composition gradient was expressed as (Max−Min)/(Max+Min). The higher the value of the quotient obtained, the greater the composition gradient.

Of the respective samples, the sample (1) took the highest value of the composition gradient at 20%, and the sample (3) took the lowest value of the composition gradient at 9.7%, meaning an approximately two-fold difference. The values for the samples (2) and (4) were nearly the same at 13%. These findings reveal that the composition gradient can be decreased as the degreasing temperature increases and the heating-up rate increases.

Figure 7A:
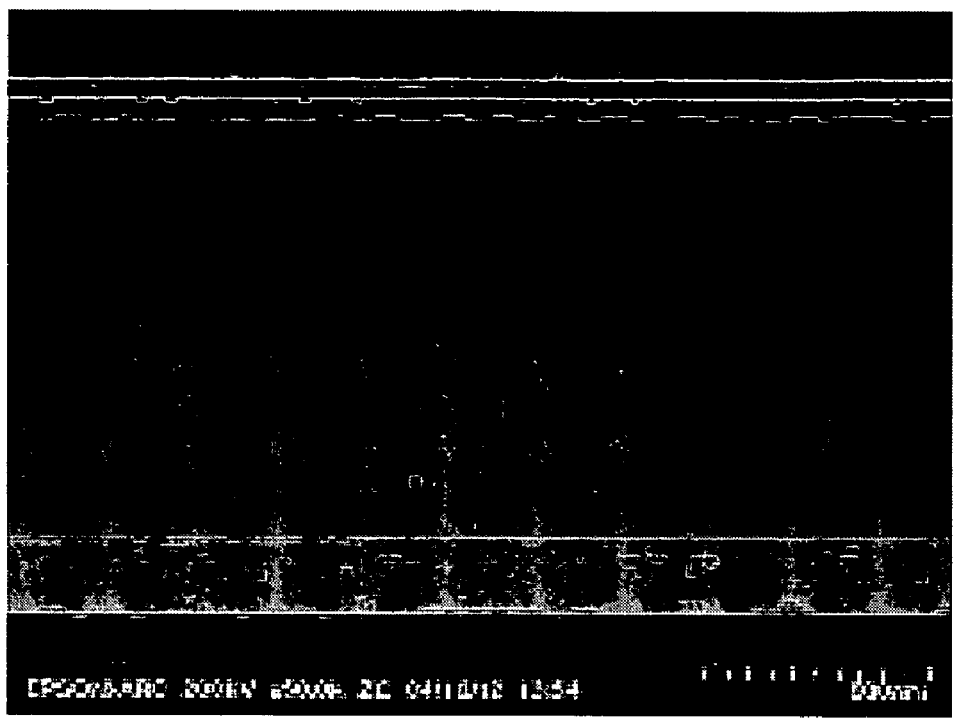
FIGS. 7A and 7B are TEM images showing the crystalline states of the piezoelectric layers.
Figure 7B:
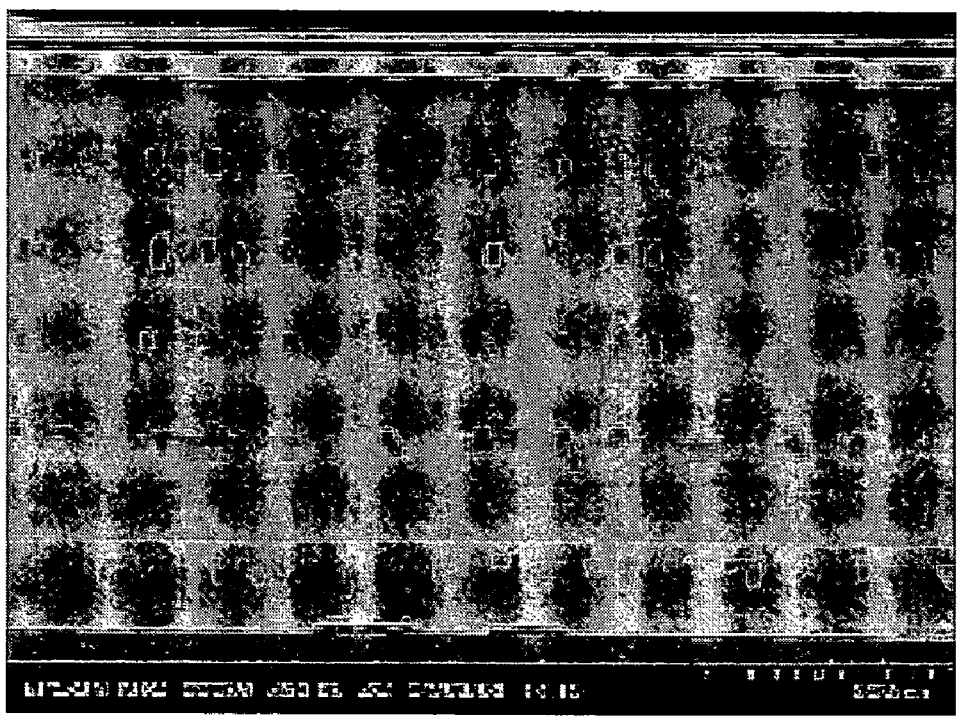

The above results are clear from the half-width of the PZT (100) peak as well. Under the conditions at which the composition gradient is greater, the half-width is larger. The results of the TEM observation of the phases in the PZT film are shown in FIGS. 7A and 7B. FIG. 7A is a sectional TEM image of the sample (1) degreased at 320° C. with the use of the jig, and FIG. 7B is a sectional TEM image of the sample (3) degreased at 400° C. in the directly placed state. As shown in the drawings, foreign matter was larger in size and higher in density in FIG. 7B, and was present in larger amounts, particularly, on the even-numbered layers, where continuity of crystals was assumed to be poor. In the samples (2) and (4), the amounts of foreign matter were intermediate between those of the samples (1) and (3). Accordingly, it is seen that the amount of foreign matter is smaller at a lower degreasing temperature and at a lower heating-up rate.

The above results are summarized in tabular form in FIG. 8. This table shows that the composition gradient and the amount of foreign matter are in a trade-off relation, and these parameters are incompatible with each other, even if the degreasing conditions are adjusted.

2. Conditions for the Second Drying Step

Figure 9:
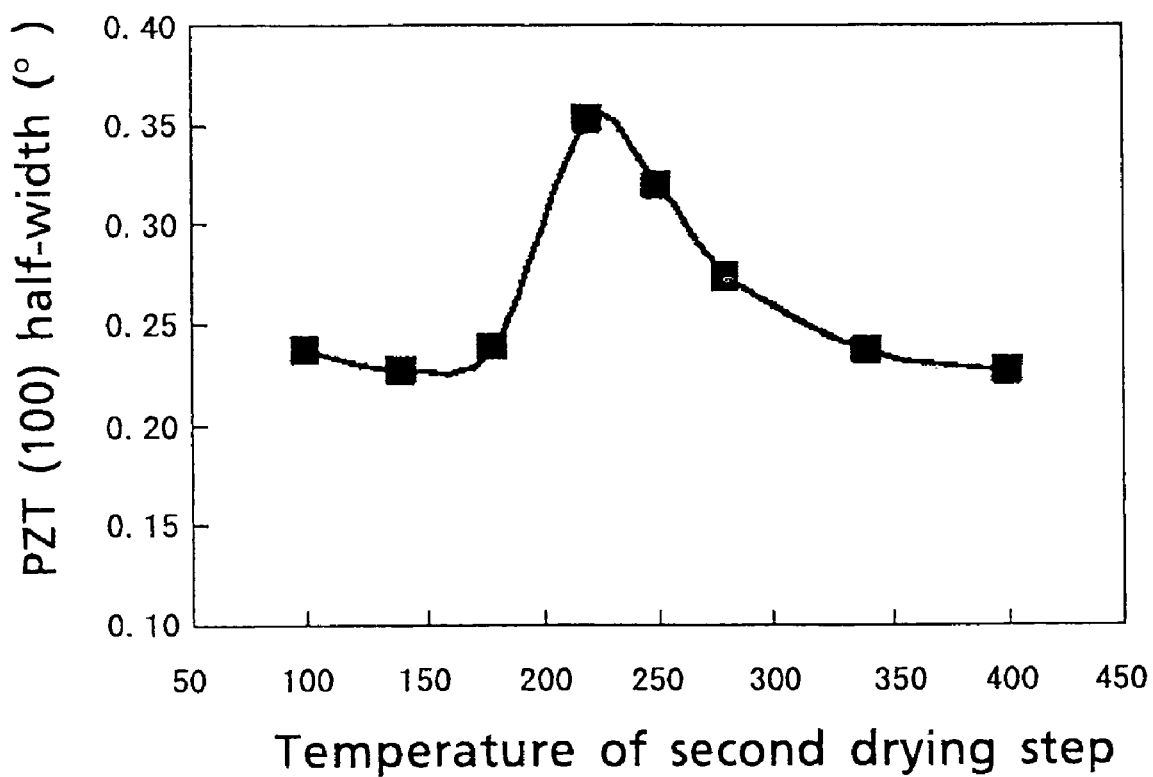
FIG. 9 is a graph showing the relationship between the PZT (100) half-width and temperature.

Next, experiments were conducted, with the temperature of the second drying step being varied. To keep the composition gradient to a minimum, the conditions for the degreasing step were fixed at (3) 400°, direct placement. The dependence of the PZT (100) diffraction peak half-width on the temperature of the second drying step was as shown in FIG. 9. The curve in FIG. 9 showed a peak at the temperature of the second drying step in the vicinity of 220° C. The half-width increased between 170° C. and 220° C., and decreased gently on a higher temperature side. The half-width at a temperature of 350° C. to 400° C. was nearly the same as that on the low temperature side.

Figure 10A:
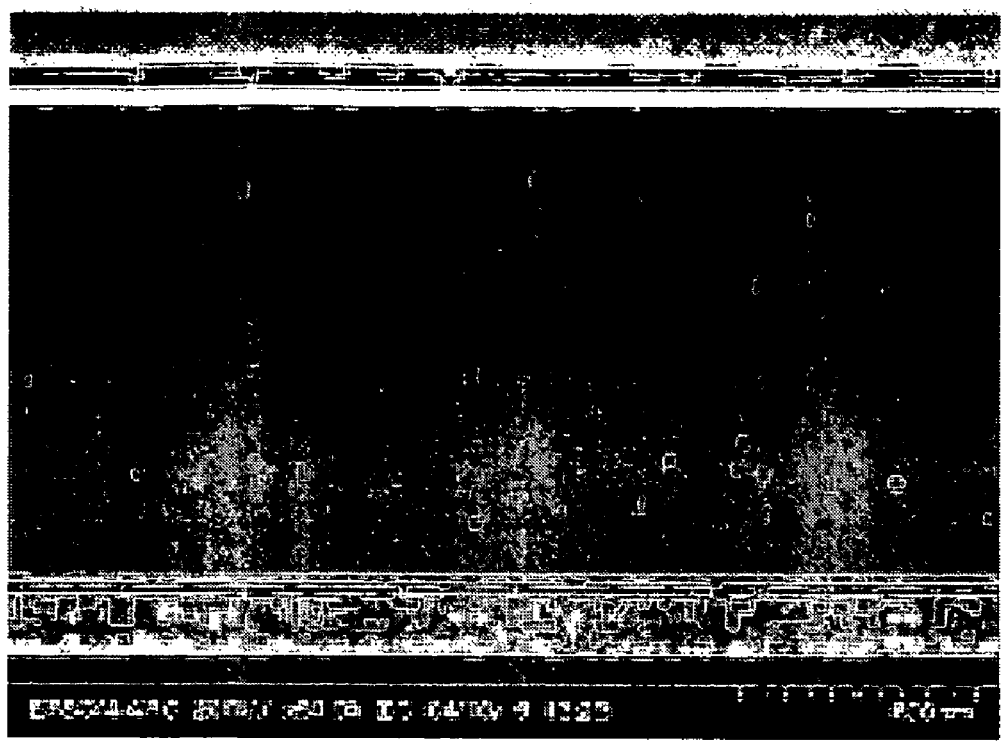
FIGS. 10A and 10B are TEM images showing the crystalline states of the piezoelectric layers.
Figure 10B:
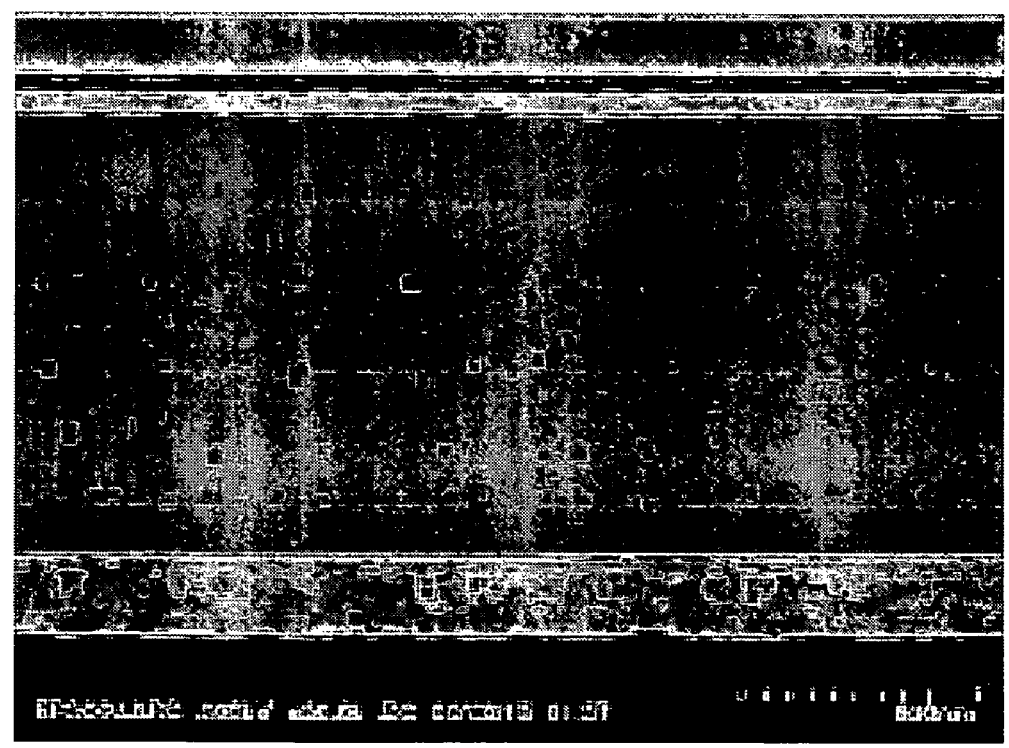

Next, the influence of the temperature of the second drying step on foreign matter contained in the film will be mentioned. A comparison will be made between the absence of the second drying step giving a small PZT (100) half-width (small composition gradient) and the temperature of the second drying step being 220° which gives a large half-width (great composition gradient) (FIGS. 10A, 10B). FIG. 10A is a sectional TEM image taken when there was no second drying step, while FIG. 10B is a sectional TEM image taken when the temperature of the second drying step was 220° C.

It is noted that the amount of foreign matter was overwhelmingly larger in the situation of FIG. 10A than in the situation of FIG. 10B. Interlayer foreign matter was present, and tiny foreign matter existed in the layers as well. In some places, foreign matter was tied together in the direction of the film surface.

To sum up, it is understood that the temperature of the second drying step should be set at 170° C. or lower, or the second drying step should be eliminated, in order to render the composition gradient small. Under such conditions, however, the amount of foreign matter increases. That is, the relation between the composition gradient and foreign matter is a trade-off as for the degreasing step. Even under the temperature conditions of the second drying step, these two parameters are incompatible.

3. Conditions for the Sintering Step

Rapid heating and sintering by RTA is adopted. The composition gradient can be reduced by the conditions of the second drying step and the conditions of the degreasing step. The problem of foreign matter is solved by markedly increasing the heating-up rate in the sintering step. To raise the heating-up rate markedly, rapid heating by RTA is performed in the sintering step.

The following is the results of experiments involving rapid heating and sintering by use of RTA. To decrease the composition gradient, the temperature of the second drying step was fixed at 160° C., and the temperature of the degreasing step was fixed at 400° C. in the direct placement state. FIG. 1A is a sectional TEM image of a sample heated up to 700° C. at 1 [° C./sec] which was lower than the heating-up rate of a diffusion furnace used in ordinary treatment (about 3 [° C./sec]) FIG. 11B is a sectional TEM image of a sample heated at a heating-up rate of 120 [° C./sec].

Figure 11A:
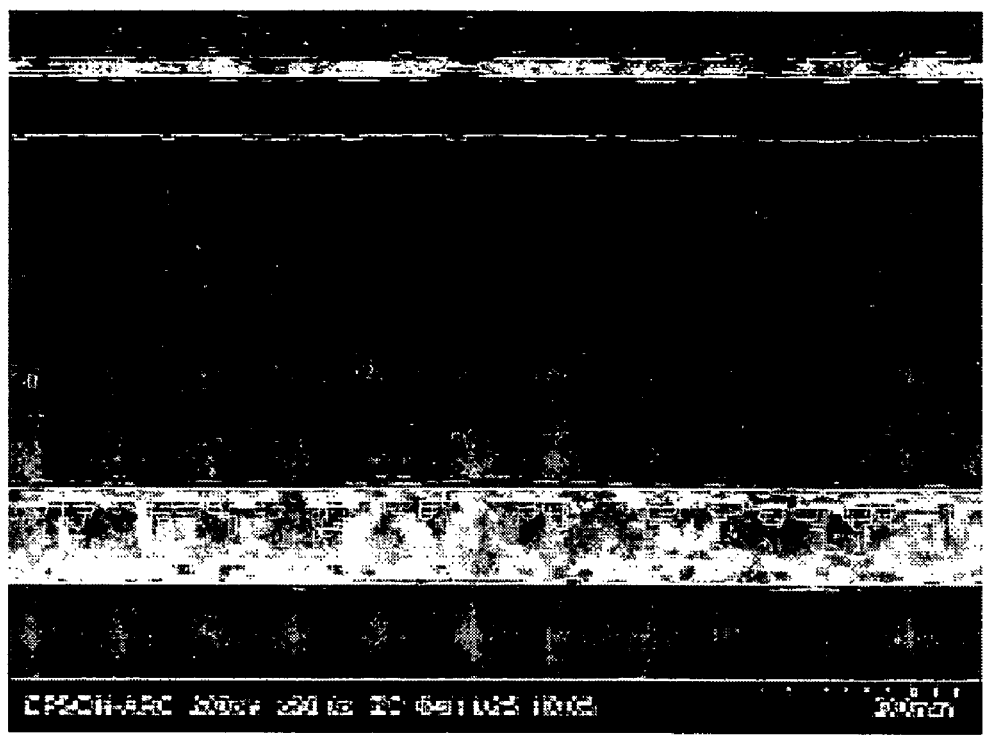
FIGS. 11A and 11B are TEM images showing the crystalline states of the piezoelectric layers.
Figure 11B:
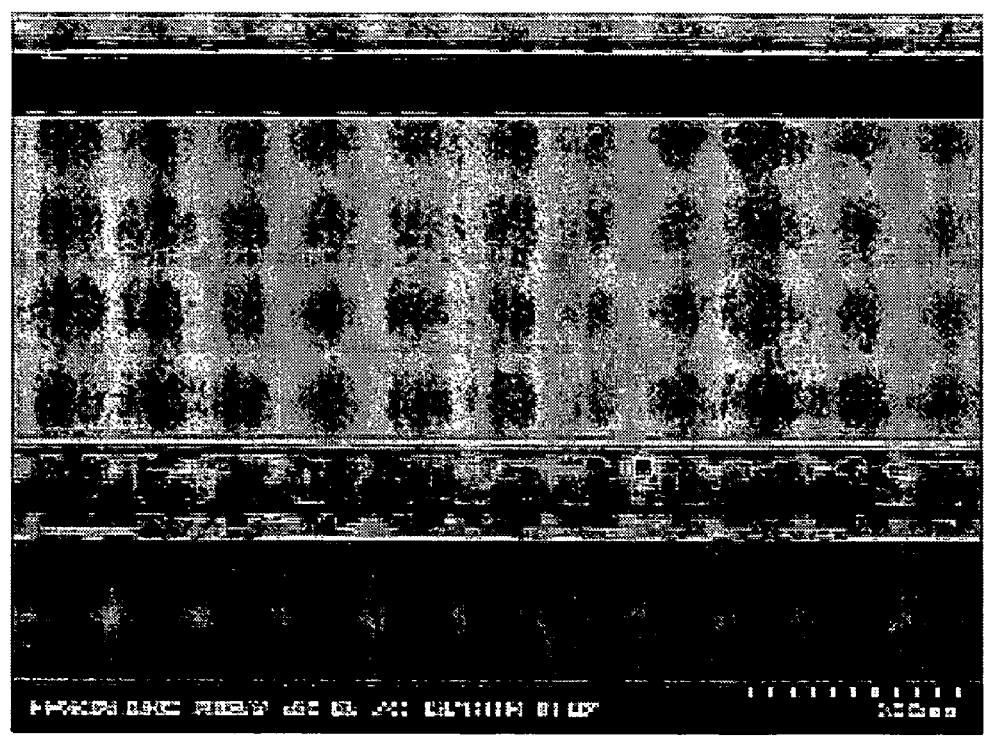

As shown in FIG. 11A, in the case of the sample heated up to 700° C. at 1 [° C./sec], foreign matter was present almost throughout the sample to a worse degree than in FIG. 10A indicated earlier. With the sample heated at a heating-up rate of 120 [° C./sec] (for example, when at 630° C.), on the other hand, it is seen that foreign matter was scanty. There was little foreign matter in the layers, and interlayer foreign matter was in a markedly small amount.

Figure 12:
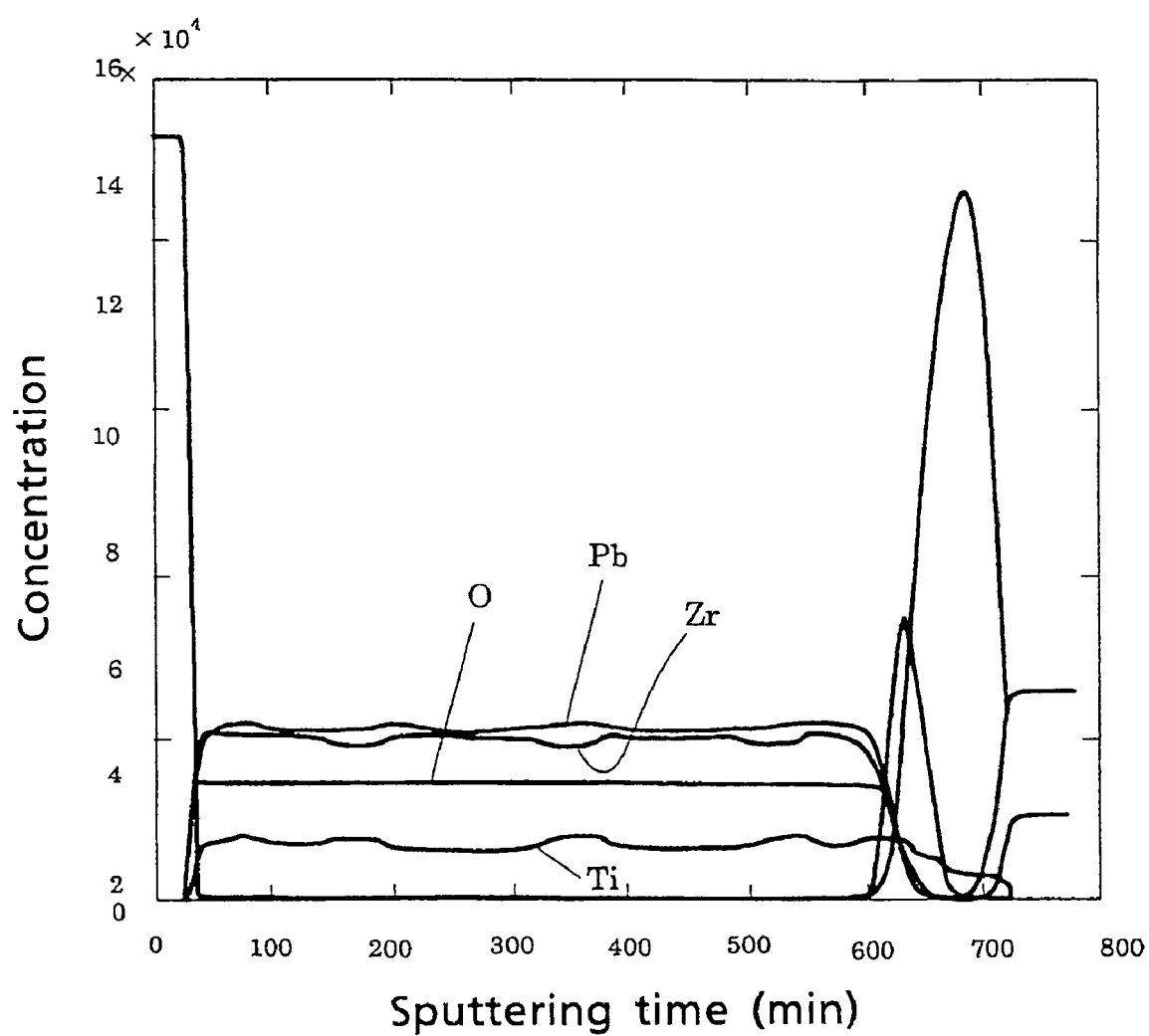
FIG. 12 is a view showing the depth profile of the piezoelectric layer.

FIG. 12 shows the distribution of concentration in the depth direction (depth profile) of the sample heated at a heating-up rate of 120 [° C./sec]. There were no variations, in the depth direction of the piezoelectric layer, in the concentrations of the PZT components constituting the piezoelectric element. That is, the composition gradient of Zr/Ti was kept down. This means that foreign matter is markedly cut down, and the uniformity of the Zr/Ti distribution is improved, by rapid heating using RTA in the sintering step to carry out treatment for 5 minutes at a heating-up rate of 120 [° C./sec].

4. Conclusion

Based on the above results, the heat treatment conditions are determined as shown below, so that the Zr/Ti composition gradient can be rendered small by the first drying step, the second drying step, and the degreasing step to distribute Zr/Ti uniformly, and foreign matter can be cut down by the sintering step.

First drying step: 140° C., 3 min.
Second drying step: 160° C., 5 min.
Degreasing step: Heating-up rate corresponding to 400° C., 5 min, direct placement on a hot plate.
Sintering step: 5 min at heating-up rate at 100 [° C./sec] to 150 [° C./sec] (rapid heating by RTA)

Figure 14:
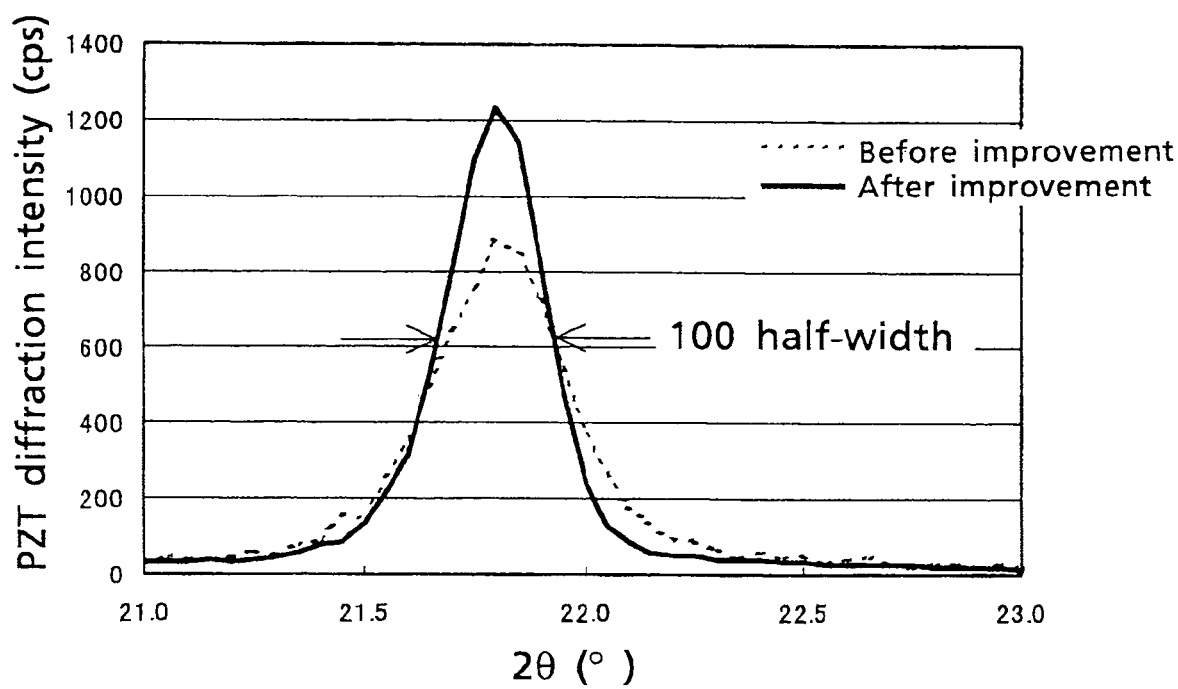
FIG. 14 is a graph showing the PZT (100) diffraction peak.

The results of the improvements in the heat treatment conditions are tabulated in FIG. 13, and the XRD waveform of PZT as the piezoelectric layer is shown in FIG. 14. FIG. 14 shows the (100) diffraction peak of PZT.

As shown in FIG. 13, the PZT (100) diffraction intensity was 600 to 1,000 cps before improvement, but increased to 1,050 to 1,350 cps after improvement. The PZT (100) peak half-width was 0.24° to 0.28° before improvement, but decreased to 0.21° to 0.22° after improvement. The Zr/Ti composition gradient by ESCA was 10% or greater before improvement, but decreased to 1.1% (less than 3%) after improvement, and foreign matter in the film was large in amount before improvement, but changed to a very small amount after improvement.

Hence, the distribution of the Zr/Ti composition is rendered small, and foreign matter is decreased so that crystals of the dielectric film (piezoelectric layer 70) can be grown satisfactorily, and the dielectric film in the desired crystalline state can be formed. That is, a PZT film having Zr/Ti at the B site uniformly distributed therein is obtained. That is, it is possible to obtain a PZT film (piezoelectric layer 70) having a high PZT (100) diffraction intensity, a small PZT (100) diffraction peak half-width, a satisfactorily uniform distribution of the Zr/Ti composition in the film, and few phases contained in the film, and thus improve piezoelectric characteristics.

Figure 15A:
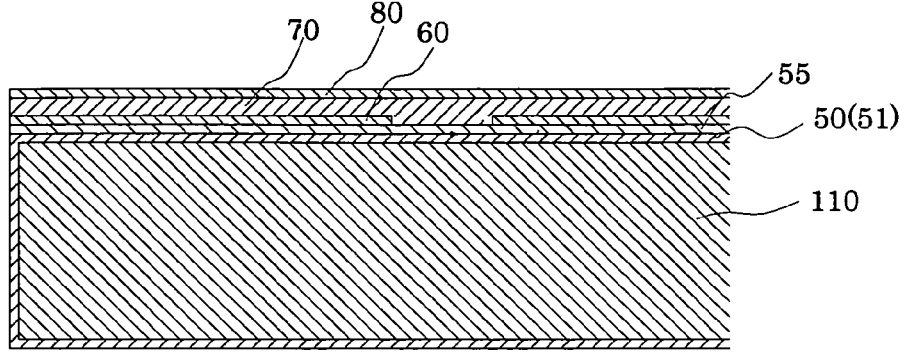
FIGS. 15A to 15D are sectional views showing the manufacturing process for the recording head according to Embodiment 1.
Figure 15B:
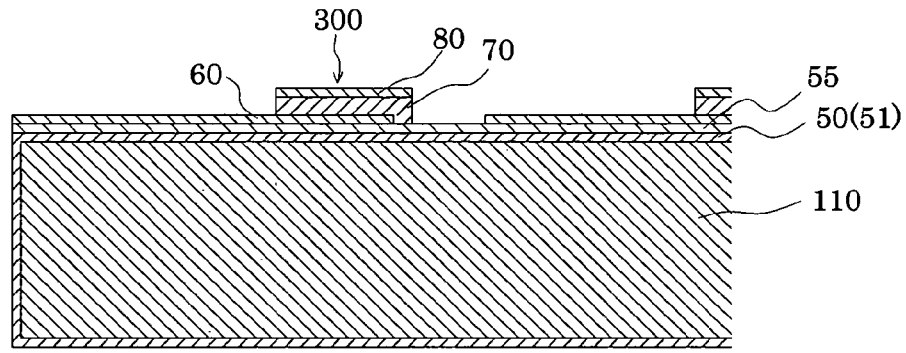
Figure 15C:
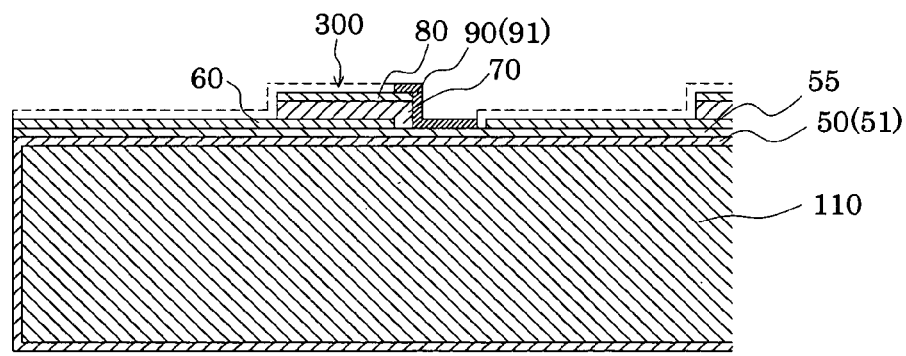

After formation of the piezoelectric layer 70 in the aforementioned manner, the upper electrode film 80 comprising, for example, iridium (Ir) is formed on the entire surface of the passage-forming substrate wafer 110, as shown in FIG. 15A. Then, the piezoelectric layer, 70 and the upper electrode film 80 are patterned in a region corresponding to each pressure generating chamber 12 to form a piezoelectric element 300, as shown in FIG. 15B. Then, the lead electrode 90 is formed. Concretely, a metal layer 91 comprising, for example, gold (Au) is formed on the entire surface of the passage-forming substrate wafer 110, as shown in FIG. 15C. Then, the metal layer 91 is patterned for each piezoelectric element 300 via a mask pattern (not shown) comprising, for example, a resist, whereby the lead electrode 90 is formed.

Figure 15D:
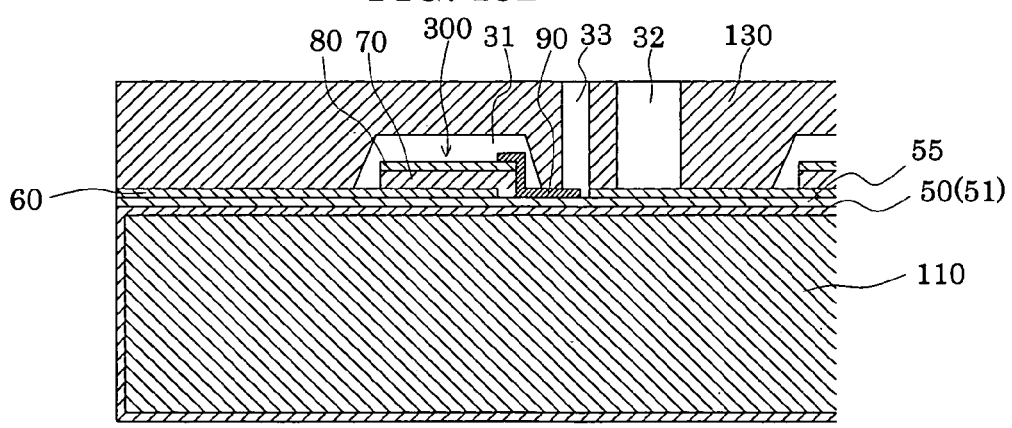

Then, as shown in FIG. 15D, a protective plate wafer 130, which is a silicon wafer and becomes a plurality of protective plates, is joined to a side of the passage-forming substrate wafer 110 where the piezoelectric elements 300 have been formed. The protective plate wafer 130 has a thickness, for example, of the order of 400 μm, and thus, the rigidity of the passage-forming substrate wafer 110 is markedly increased by joining the protective plate wafer 130.

Figure 16A:
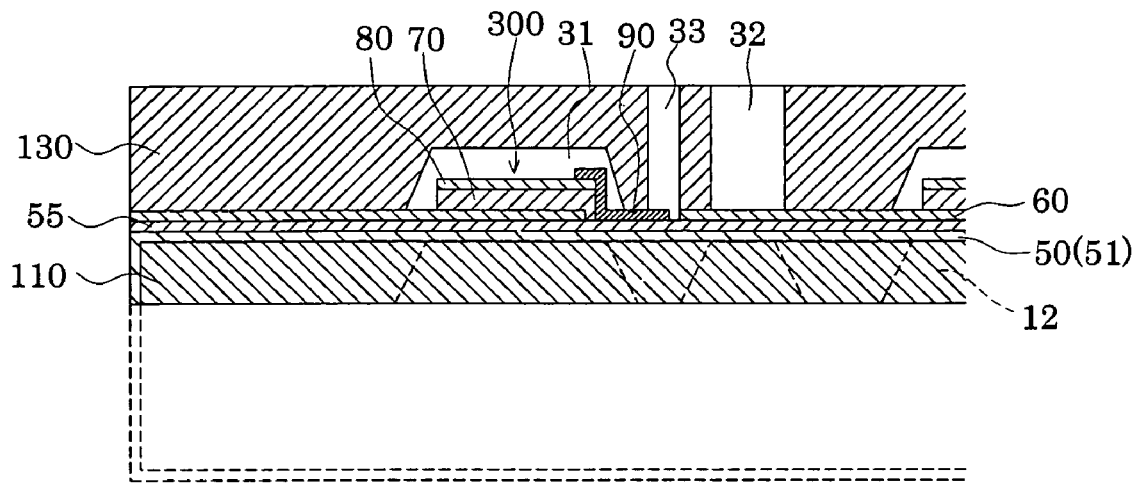
FIGS. 16A to 16C are sectional views showing the manufacturing process for the recording head according to Embodiment 1.
Figure 16B:
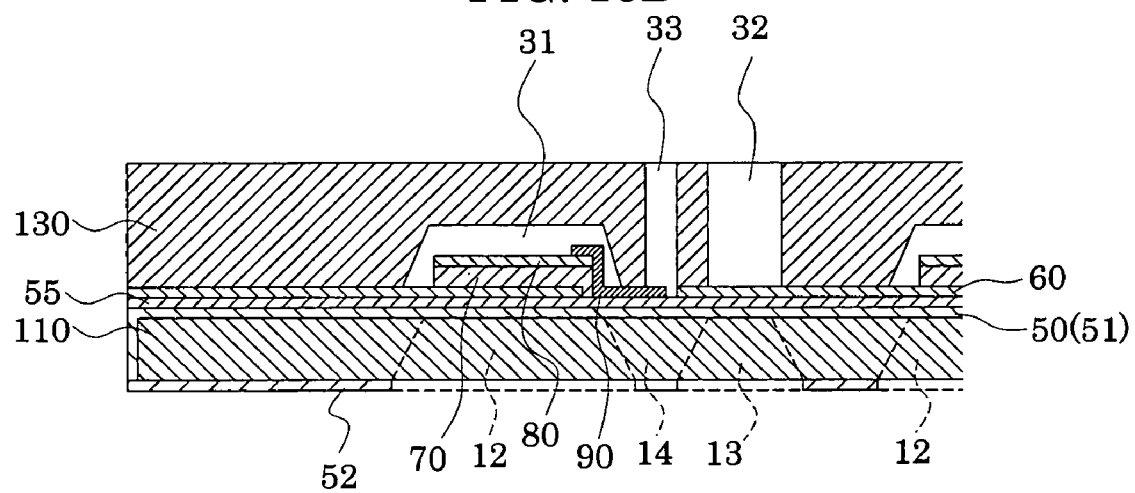
Figure 16C:
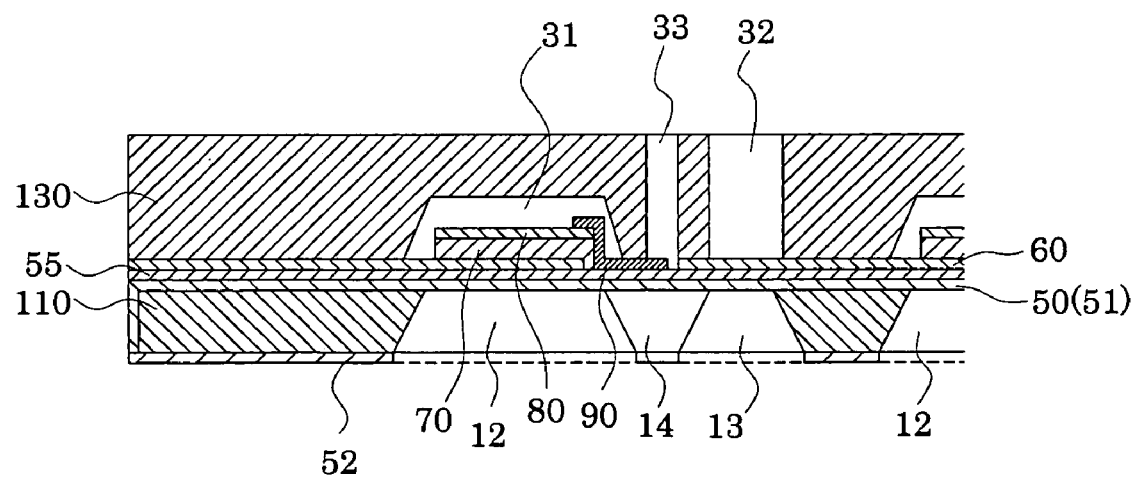

Then, as shown in FIG. 16A, the passage-forming substrate wafer 110 is polished to a certain thickness, and then wet etched with fluoronitric acid to impart a predetermined thickness to the passage-forming substrate wafer 110. In the present embodiment, for example, the passage-forming substrate wafer 110 is etched to have a thickness of about 70 μm. Then, as shown in FIG. 16B, a mask film 52 comprising, for example, silicon nitride (SiN) is newly formed on the passage-forming substrate wafer 110, and patterned into a predetermined shape. The passage-forming substrate wafer 110 is anisotropically etched via the mask film 52 to form the pressure generating chambers 12, the communicating portion 13, and the ink supply paths 14 in the passage-forming substrate wafer 110, as shown in FIG. 16C.

Then, unnecessary portions of the outer peripheral edge portions of the passage-forming substrate wafer 110 and the protective plate wafer 130 are removed by cutting using, for example, dicing. Then, the nozzle plate 20 having the nozzle orifices 21 bored therein is joined to a surface of the passage-forming substrate wafer 110 on the side opposite to the protective plate wafer 130, and the compliance plate 40 is joined to the protective plate wafer 130. Further, the passage-forming substrate wafer 110, etc. are divided into the passage-forming substrates 10, each of a single chip size, as shown in FIG. 1, thereby preparing the ink-jet recording head of the present embodiment.

Thus, the resulting ink-jet recording head can be a liquid-jet head furnished with the piezoelectric elements 300 each having the piezoelectric layer 70 comprising the dielectric film in the desired crystalline state.

Other Embodiments

The embodiments of the present invention have been described above, but the present invention is not limited to these embodiments. In the above-described embodiments, the ink-jet recording head is taken as an example for illustrating the present invention. However, the present invention can be applied to heads for jetting liquids other than ink other liquid-jet heads include, for example, various recording heads for use in image recording devices such as printers, color material jet heads for use in the production of color filters for liquid crystal displays, electrode material jet heads for use in the formation of electrodes for organic EL displays and FED (face emitting displays), and bio-organic material jet heads for use in the production of biochips.

Furthermore, the present invention is not limited to the method for producing the liquid-jet head having the piezoelectric elements. That is, the present invention is not limited to the method for producing the piezoelectric layer comprising the piezoelectric material, but needless to say, can be applied to the production of dielectric films comprising every dielectric material. It should be understood that such changes, substitutions and alterations can be made therein without departing from the spirit and scope of the invention as defined by the appended claims.

What is claimed is:

1. A dielectric film containing Pb, Zr and Ti, and wherein (Max−Min)/(Max+Min) is less than 3% where Max and Min are a maximum value and a minimum value, respectively, of a measured intensity of Zr in a depth direction of the dielectric film measured by an electron spectroscopy of chemical analysis (ESCA).

2. A liquid-jet apparatus including a liquid-jet head having the piezoelectric element according to claim 1 as a drive source for ejecting liquid droplets through nozzle orifices.

3. The dielectric film according to claim 1, wherein a (100) peak half-width measured by an X-ray diffraction (XRD) is 0.22° or less.

4. The dielectric film according to claim 1 formed by a sol-gel process.

5. A piezoelectric element comprising a lower electrode, the dielectric film according to claim 1, and an upper electrode.

* * * * *